(12) United States Patent
Cha et al.

(10) Patent No.: US 12,225,793 B2
(45) Date of Patent: Feb. 11, 2025

(54) DISPLAY DEVICE HAVING COMPONENT AREA

(71) Applicant: SAMSUNG DISPLAY CO., LTD., Yongin-si (KR)

(72) Inventors: Hyunji Cha, Yongin-si (KR); Youngsoo Yoon, Yongin-si (KR); Yunkyeong In, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/310,504

(22) Filed: May 1, 2023

(65) Prior Publication Data

US 2023/0269983 A1 Aug. 24, 2023

Related U.S. Application Data

(63) Continuation of application No. 17/198,509, filed on Mar. 11, 2021, now Pat. No. 11,641,769.

(30) Foreign Application Priority Data

May 14, 2020 (KR) .................. 10-2020-0057828

(51) Int. Cl.
  *G09G 3/32* (2016.01)
  *G09G 3/3258* (2016.01)
  (Continued)

(52) U.S. Cl.
  CPC ......... *H10K 59/131* (2023.02); *G09G 3/3258* (2013.01); *H01L 29/7869* (2013.01)

(58) Field of Classification Search
  CPC .. G09G 3/32; G09G 3/36; G09G 3/30; G09G 3/3258; G09G 5/00; G09G 2300/0426;
  (Continued)

(56) References Cited

U.S. PATENT DOCUMENTS

| | | |
|---|---|---|
| 7,414,599 B2 | 8/2008 | Chung et al. |
| 10,734,458 B2 | 8/2020 | Kang et al. |

(Continued)

FOREIGN PATENT DOCUMENTS

| | | |
|---|---|---|
| KR | 10-0560780 B1 | 3/2006 |
| KR | 10-1924996 B1 | 12/2018 |

(Continued)

*Primary Examiner* — Pegeman Karimi
(74) *Attorney, Agent, or Firm* — Lewis Roca Rothgerber Christie LLP

(57) ABSTRACT

A display device includes: a plurality of main display elements in the main display area; a plurality of auxiliary display elements and a transmission area in the component area; a first pixel circuit in the component area and connected to a first auxiliary display element among the auxiliary display elements; a second pixel circuit in the component area and connected to a second auxiliary display element among the auxiliary display elements, the second pixel circuit neighboring the first pixel circuit in a column direction; and a first initialization voltage line in the component area, extending in a row direction, arranged between the first pixel circuit and the second pixel circuit, and connected to the first pixel circuit and the second pixel circuit, wherein the first pixel circuit and the second pixel circuit are symmetric with respect to the first initialization voltage line.

20 Claims, 17 Drawing Sheets

(51) Int. Cl.
*H01L 29/786* (2006.01)
*H10K 59/131* (2023.01)

(58) Field of Classification Search
CPC ... G09G 2300/0452; G09G 2300/0819; G09G 2300/0842; G09G 2300/0861; G09G 3/3233; H01L 29/7869; H01L 27/3276; H01L 27/1225; H01L 27/124; H10K 59/131; H10K 59/352; H10K 59/1213
See application file for complete search history.

(56) References Cited

U.S. PATENT DOCUMENTS

| | | | |
|---|---|---|---|
| 2016/0125809 A1* | 5/2016 | Hwang | G09G 3/3258 |
| | | | 345/212 |
| 2018/0144685 A1* | 5/2018 | Gong | H10K 59/1213 |
| 2019/0125809 A1* | 5/2019 | Bailey | A61P 43/00 |
| 2020/0066809 A1 | 2/2020 | Liu | |
| 2020/0243015 A1 | 7/2020 | Hyeon et al. | |
| 2021/0193691 A1* | 6/2021 | Lee | G09G 3/3233 |
| 2021/0335297 A1* | 10/2021 | Huangfu | G09G 3/2003 |

FOREIGN PATENT DOCUMENTS

| | | |
|---|---|---|
| KR | 10-2019-0014216 A | 2/2019 |
| KR | 10-1973752 B1 | 4/2019 |

* cited by examiner

DISPLAY DEVICE HAVING COMPONENT AREA

CROSS-REFERENCE TO RELATED APPLICATIONS

This application is a continuation of U.S. patent application Ser. No. 17/198,509, filed Mar. 11, 2021, which claims priority to and the benefit of Korean Patent Application No. 10-2020-0057828, filed May 14, 2020, the entire content of both of which is incorporated herein by reference.

BACKGROUND

1. Field

Aspects of one or more example embodiments relate to a display device.

2. Description of Related Art

With the advancement of technology, the various uses and applications for display devices has become more and more diverse. In addition, as display devices have become thinner and lighter, their range of uses has gradually expanded.

As display devices are variously utilized, there may be various methods in designing the shape of display devices, and functions that may be combined or associated with display devices have increased.

The above information disclosed in this Background section is only for enhancement of understanding of the background and therefore the information discussed in this Background section does not necessarily constitute prior art.

SUMMARY

Aspects of one or more example embodiments relate to a display device, and for example, to a display panel in which a display area extends to display an image even in a region in which a component is arranged, and a display device including the display panel, the component being an electronic element.

Aspects of one or more example embodiments include a display panel in which a display area extends to display an image even in a region in which a component is arranged, and a display device including the display panel, the component being an electronic element. However, it should be understood that example embodiments described herein should be considered in a descriptive sense only and not for limitation of the disclosure.

Additional aspects will be set forth in part in the description which follows and, in part, will be more apparent from the description, or may be learned by practice of the presented example embodiments of the disclosure.

According to one or more example embodiments, a display device including a main display area, a component area, and a peripheral area, main display elements being arranged in the main display area, auxiliary display elements and a transmission area being arranged in the component area, and the peripheral area being outside the main display area, the display apparatus includes a first pixel circuit arranged in the component area and connected to a first auxiliary display element among the auxiliary display elements, a second pixel circuit arranged in the component area and connected to a second auxiliary display element among the auxiliary display elements, the second pixel circuit neighboring the first pixel circuit in a column direction, and a first initialization voltage line arranged in the component area, extending in a row direction, arranged between the first pixel circuit and the second pixel circuit, and connected to the first pixel circuit and the second pixel circuit, wherein the first pixel circuit and the second pixel circuit are symmetric with respect to the first initialization voltage line.

According to some example embodiments, each of the first pixel circuit and the second pixel circuit may include a first thin film transistor including a first semiconductor layer and a first gate electrode, and a second thin film transistor including a second semiconductor layer and a second gate electrode and connected to the first gate electrode and the first initialization voltage line.

According to some example embodiments, the first semiconductor layer of the first thin film transistor may include a silicon semiconductor, and the second semiconductor layer of the second thin film transistor may include an oxide semiconductor.

According to some example embodiments, the display device may further include a driving voltage line extending in the column direction.

According to some example embodiments, the display device may further include an initialization voltage supply line arranged in the peripheral area and connected to the first initialization voltage line.

According to some example embodiments, the display device may further include a first vertical voltage line extending in the column direction and connected to the first initialization voltage line.

According to some example embodiments, the display device may further include an initialization voltage supply line arranged in the peripheral area and connected to the first vertical voltage line.

According to some example embodiments, the display device may further include a second initialization voltage line connected to the first pixel circuit, and a third initialization voltage line connected to the second pixel circuit, wherein the second initialization voltage line and the third initialization voltage line may be symmetric with respect to the first initialization voltage line.

According to some example embodiments, a first initialization voltage applied to the first initialization voltage line may be different from a second initialization voltage applied to the second initialization voltage line.

According to some example embodiments, the display device may further include a second vertical voltage line extending in the column direction and connected to the second initialization voltage line and the third initialization voltage line.

According to one or more example embodiments, a display device includes a substrate including a main display area and a component area, main display elements being arranged in the main display area, and auxiliary display elements and a transmission area being arranged in the component area, a first initialization voltage line arranged in the component area, extending in a first direction, and arranged between a first row and a second row, a second initialization voltage line arranged in the component area, extending in the first direction, and arranged on the first row, and a third initialization voltage line arranged in the component area, extending in the first direction, and arranged on the second row, wherein a first pixel circuit and a second pixel circuit are symmetric with respect to the first initialization voltage line, the first pixel circuit being arranged on the first row, and the second pixel circuit being arranged on the second row and neighboring a second direction intersecting with the first direction.

According to some example embodiments, the first pixel circuit may be connected to the first initialization voltage line and the second initialization voltage line, and the second pixel circuit may be connected to the first initialization voltage line and the third initialization voltage line.

According to some example embodiments, the display device may further include a driving voltage line connected to the first pixel circuit and the second pixel circuit and extending in the second direction.

According to some example embodiments, the driving voltage line may be arranged with an interval of a column in the first direction.

According to some example embodiments, the display device may further include a first initialization voltage supply line connected to the first initialization voltage line, and a second initialization voltage supply line connected to the second initialization voltage line and the third initialization voltage line, the first initialization voltage supply line and the second initialization voltage supply line being arranged in the peripheral area.

According to some example embodiments, the display device may further include a first vertical voltage line extending in the second direction and connected to the first initialization voltage line.

According to some example embodiments, the display device may further include a driving voltage line extending in the second direction, and a second vertical voltage line extending in the second direction and connected to the second initialization voltage line and the third initialization voltage line, wherein the driving voltage line, the first vertical voltage line, and the second vertical voltage line may be alternately arranged with an interval of a column in the first direction.

According to some example embodiments, the display device may further include a first initialization voltage supply line connected to the first vertical voltage line, and a second initialization voltage supply line connected to the second vertical voltage line, the first initialization voltage supply line and the second initialization voltage supply line being arranged in the peripheral area outside the main display area.

According to some example embodiments, each of the first pixel circuit and the second pixel circuit may include a first thin film transistor including a first semiconductor layer and a first gate electrode, and a second thin film transistor including a second semiconductor layer and a second gate electrode and connected to the first gate electrode and the first initialization voltage line.

According to some example embodiments, the first semiconductor layer of the first thin film transistor may include a silicon semiconductor, and the second semiconductor layer of the second thin film transistor may include an oxide semiconductor.

BRIEF DESCRIPTION OF THE DRAWINGS

The above and other aspects, features, and characteristics of certain example embodiments according to the present disclosure will be more apparent from the following description taken in conjunction with the accompanying drawings, in which.

DETAILED DESCRIPTION

Figure 1:
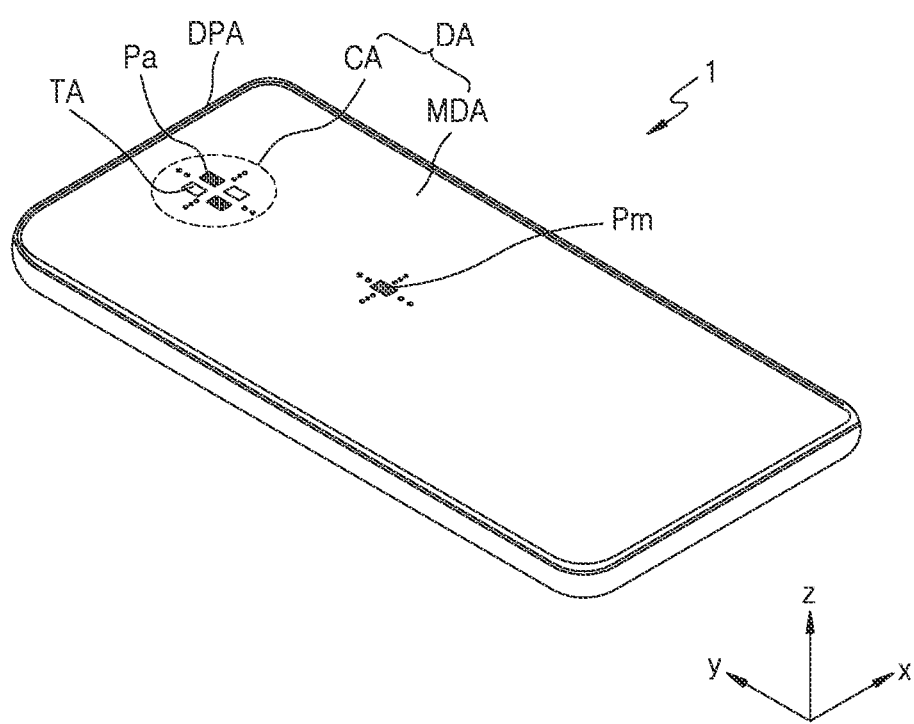
FIG. 1 is a perspective view of a display device according to some example embodiments.

Reference will now be made in more detail to aspects of some example embodiments, which are illustrated in the accompanying drawings, wherein like reference numerals refer to like elements throughout. In this regard, the embodiments according to the present disclosure may have different forms and should not be construed as being limited to the descriptions set forth herein. Accordingly, aspects of some example embodiments are merely described below, by referring to the figures, to explain aspects of embodiments according to the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, example embodiments will be illustrated in the drawings and described in detail in the written description. Effects and characteristics of the present disclosure, and a method of accomplishing the same will become apparent and more readily appreciated from the following description of the embodiments and the accompanying drawings. However, embodiments according to the present disclosure are not limited to embodiments below and may be implemented in various forms.

Hereinafter, aspects of some example embodiments are described in more detail below with reference to the accompany drawings. When description is made with reference to the drawings, like reference numerals are given to like or corresponding elements, and some repeated descriptions thereof may be omitted for brevity.

It will be understood that when a layer, region, or element is referred to as being "formed on," another layer, region, or element, it can be directly or indirectly formed on the other layer, region, or element. That is, for example, intervening layers, regions, or elements may be present. Sizes of elements in the drawings may be exaggerated or reduced for convenience of explanation. In other words, since sizes and thicknesses of elements in the drawings are arbitrarily illustrated for convenience of explanation, the following embodiments are not limited thereto.

As used herein, "on a plan view" means that an objective portion is viewed from above, and "on a cross-sectional view" means that a cross-section of an objective portion taken vertically is viewed from a lateral side. As used herein, when it is referred that a first element "overlaps" a second element, the first element is arranged above or below the second element.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display device 1 according to some example embodiments.

Referring to FIG. 1, the display device 1 includes a display area DA and a peripheral area DPA outside the display area DA. The display area DA includes a component area CA and a main display area MDA, the main display area MDA at least partially surrounding the component area CA. That is, the component area CA and the main display area MDA may display an image individually or in cooperation with each other. The peripheral area DPA may include a non-display area in which display elements are not arranged. The display area DA may be entirely surrounded by the peripheral area DPA.

It is shown in FIG. 1 that one component area CA is arranged inside the main display area MDA. According to some example embodiments, the display device 1 may include two or more component areas CA. The shapes, sizes, and locations of the plurality of component areas CA may be different from each other, and may be any suitable shape size, or location according to the design of the display device 1. When viewed in a plan view (e.g., a view in a direction perpendicular (or approximately perpendicular) or normal with respect to the top surface (e.g., a plane of the display surface)) of the display device 1, the component area CA may have various shapes such as a circle, an ellipse, a polygon including a quadrangle, a hexagon, and an octagon, a star shape, or a diamond shape. Though it is shown in FIG. 1 that, in a plan view (e.g., when viewed in a direction perpendicular (approximately perpendicular) or normal with respect to the top surface (e.g., a plane of the display surface)) of the display device 1, the component area CA is arranged at the top center (a +y direction) of the main display area MDA having an approximately quadrangular shape, the component area CA may be arranged in any suitable location according to the design of the display device 1, for example, at one side of the main display area MDA, which has a quadrangular shape, for example, on the top right side or the top left side.

The display device 1 may display an image by using a plurality of main sub-pixels Pm and a plurality of auxiliary sub-pixels Pa, the plurality of main sub-pixels Pm being arranged in the main display area MDA, and the plurality of auxiliary sub-pixels Pa being arranged in the component area CA.

In the component area CA, as described below with reference to FIG. 2, a component 40, which is an electronic element, may be arranged below a display panel 10 to correspond to the component area CA. The component 40 may include a camera that uses infrared or visible light, etc. and include an imaging element. Alternatively, the component 40 may include a solar battery, a flash, an illuminance sensor, a proximity sensor, and an iris sensor. Alternatively, the component 40 may have a function of receiving sound. To minimize or reduce limitations on the function of the component 40, the component area CA may include a transmission area TA through which light and/or sound output from the component 40 to the outside or progressing toward the component 40 from the outside may pass. In the display panel and the display device including the display panel according to some example embodiments, when light is allowed to pass through the component area CA, a light transmittance may be 10% or more, more preferably, 40% or more, 25% or more, 50% or more, 85% or more, or 90% or more.

The plurality of auxiliary sub-pixels Pa may be arranged in the component area CA. The plurality of auxiliary sub-pixels Pa may display an image by emitting light. An image displayed in the component area CA includes an auxiliary image and may have a resolution less than an image displayed in the main display area MDA. That is, the component area CA includes the transmission area TA through which light and sound may pass. In the case where sub-pixels are not arranged in the transmission area TA, the number of auxiliary sub-pixels Pa that may be arranged per unit area of the component area CA may be less than the number of main sub-pixels Pm arranged per unit area of the main display area MDA.

Figure 2:
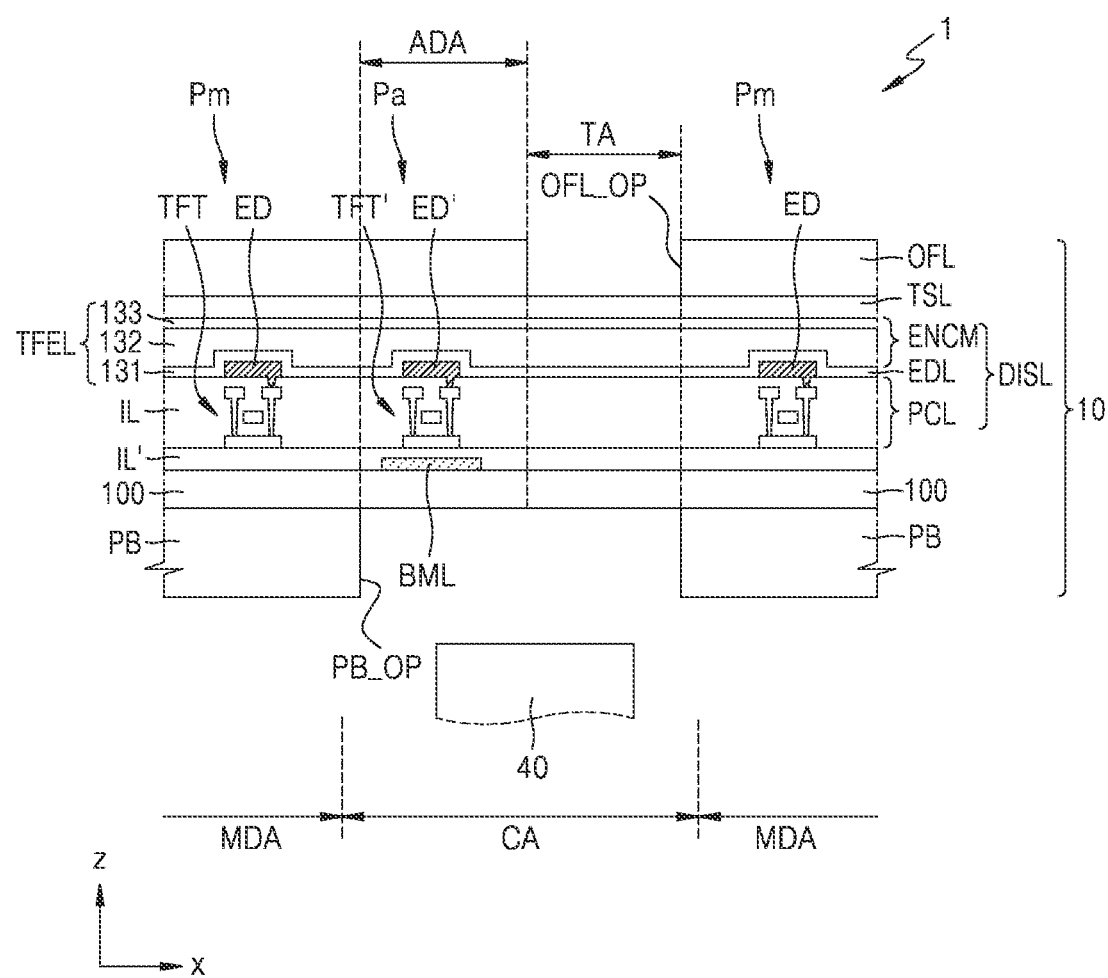
FIG. 2 is a cross-sectional view of a portion of a cross-section of the display device according to some example embodiments.

FIG. 2 is a cross-sectional view of a portion of a cross-section of the display device 1 according to some example embodiments.

Referring to FIG. 2, the display device 1 may include the display panel 10 and the component 40 overlapping the display panel 10. According to some example embodiments, a cover window may be further arranged on the display panel 10, the cover window protecting the display panel 10.

The display panel 10 includes the component area CA and the main display area MDA, the component area CA including a region overlapping the component 40, and a main image being displayed in the main display area MDA. The display panel 10 may include a substrate 100, a display layer DISL, a touchscreen layer TSL, an optical functional layer OFL on the substrate 100, and a panel protection member PB, the panel protection member PB being under the substrate 100.

The display layer DISL may include a circuit layer PCL, a display element layer EDL, and a sealing member ENCM such as a thin-film encapsulation layer TFEL or a sealing substrate. The circuit layer PCL includes a plurality of thin film transistors TFT and TFT', and the display element layer EDL includes a plurality of light-emitting diodes ED and ED', which are display elements. Insulating layers IL and IL' may be between the substrate 100 and the display layer DISL, and inside the display layer DISL.

The substrate 100 may include an insulating material such as glass, quartz, and/or a polymer resin. The substrate 100 may include a rigid substrate or may be a flexible substrate that is bendable, foldable, and/or rollable.

A main sub-pixel Pm including a main light-emitting diode ED and a main thin film transistor TFT being connected to the main sub-pixel Pm may be arranged in the main display area MDA of the display panel 10. An auxiliary sub-pixel Pa including an auxiliary light-emitting diode ED' and an auxiliary thin film transistor TFT' being connected to the auxiliary sub-pixel Pa may be arranged in the component area CA. A region in which auxiliary sub-pixels Pa are arranged of the component area CA may be referred to as a sub-pixel area ADA.

In addition, the transmission area TA may be arranged in the component area CA, display elements not being arranged in the transmission area TA to enable light or signals to pass through the transmission area TA without being blocked by non-transmissive elements or components. That is, the transmission area TA may include a region through which light and/or a signal emitted from the component 40 or light and/or a signal incident to the component 40 may pass through to the component or from the component, the component 40 being arranged to correspond to the component area CA. The sub-pixel area ADA and the transmission area TA may be alternately arranged in the component area CA. Thus, as illustrated in FIG. 2, the density of thin film transistors, light-emitting diodes, and/or other electrical components that may be non-transmissive of signals or light, may be lower in the component area CA than the main display area MDA, in order to accommodate the transmission area TA.

A bottom metal layer BML may be arranged in the component area CA. The bottom metal layer BML may be arranged to correspond to below the auxiliary thin film transistor TFT'. For example, the bottom metal layer BML may be between the auxiliary thin film transistor TFT' and the substrate 100. The bottom metal layer BML may block external light from reaching the auxiliary thin film transistor TFT'. According to some example embodiments, a constant voltage or signal may be applied to the bottom metal layer BML.

The display element layer EDL may be covered by the thin-film encapsulation layer TFEL or a sealing substrate. According to some example embodiments, the thin-film encapsulation layer TFEL may include at least one inorganic encapsulation layer and at least one organic encapsulation layer. According to some example embodiments, the thin-film encapsulation layer TFEL may include first and second inorganic encapsulation layers 131 and 133 and an organic encapsulation layer 132 therebetween.

The first and second inorganic encapsulation layers 131 and 133 may include at least one inorganic insulating material among aluminum oxide, titanium oxide, tantalum oxide, hafnium oxide, zinc oxide, silicon oxide, silicon nitride, or silicon oxynitride. The organic encapsulation layer 132 may include a polymer-based material. The polymer-based material may include an acryl-based resin, an epoxy-based resin, polyimide, and polyethylene.

In the case where the display element layer EDL is sealed by the sealing substrate, the sealing substrate may face the substrate 100 with the display element layer EDL therebetween. There may be a gap between the sealing substrate and the display element layer EDL. The sealing substrate may include glass. Sealant may be between the substrate 100 and the sealing substrate, the sealant including frit and being arranged in the peripheral area DPA. The sealant arranged in the peripheral area DPA may surround the display area DA and prevent or reduce instances of moisture or other contaminants penetrating into the display area DA through a lateral surface of the display area DA.

The touchscreen layer TSL may obtain coordinate information corresponding to an external input, for example, a touch event. The touchscreen layer TSL may include a touch electrode and touch wirings, the touch wirings being connected to the touch electrode. The touchscreen layer TSL may detect an external input (e.g., from a user's finger, a stylus, and the like) by using a self-capacitive method or a mutual capacitive method.

The touchscreen layer TSL may be formed on the thin-film encapsulation layer TFEL. Alternatively, the touchscreen layer TSL may be separately formed on the touchscreen and then coupled to the thin-film encapsulation layer TFEL through an adhesive layer such as an optically clear adhesive (OCA). According to some example embodiments, the touchscreen layer TSL may be directly formed right on the thin-film encapsulation layer TFEL. In this case, the adhesive layer may not be arranged between the touchscreen layer TSL and the thin-film encapsulation layer TFEL.

The optical functional layer OFL may include a reflection prevention layer. The reflection prevention layer may reduce reflectivity of light (external light) incident toward the display apparatus 1 from the outside.

According to some example embodiments, the optical functional layer OFL may include a polarizing film. The optical functional layer OFL may include an opening OFL_OP corresponding to the transmission area TA. Accordingly, a light transmittance of the transmission area TA may be remarkably improved. A transparent material such as an optically clear resin (OCR) may fill the opening OFL_OP.

According to some example embodiments, the optical functional layer OFL may include a filter plate including a black matrix and color filters.

According to some example embodiments, a cover window may be arranged on the display panel 10 to protect the display panel 10. The optical functional layer OFL may be attached on the cover window by using an optically clear adhesive or attached on the touchscreen layer TSL by using an optically clear adhesive.

The panel protection member PB may be attached to the bottom of the substrate 100 to support and protect the substrate 100. The panel protection member PB may include an opening PB_OP corresponding to the component area CA. Because the opening PB_OP is formed in the panel protection member PB at a region corresponding to the component area CA, according to some example embodiments, (such that a portion of the panel protection member PB is removed or not present at the component area CA), a light transmittance of the component area CA may be relatively improved (compared to embodiments in which the panel protection member PB is present at the component area CA). The panel protection member PB may include, for example, polyethylene terephthalate (PET) or polyimide (PI).

The area of the component area CA may be greater than an area in which the component 40 is arranged. Accordingly, the area of the opening PB_OP formed in the panel protection member PB may not coincide with the area of the component area CA.

In addition, a plurality of components 40 may be arranged in the component area CA (or in multiple component areas CA). The functions of the plurality of components 40 may be different from each other. For example, in embodiments in which a plurality of components 40 are arranged in the component area CA (or in multiple component areas CA) the plurality of components 40 may include at least two of a camera (an imaging element), a solar battery, a flash, a proximity sensor, an illuminance sensor, and/or an iris sensor, or any other suitable component configured to emit or receive external signals.

Figure 3:
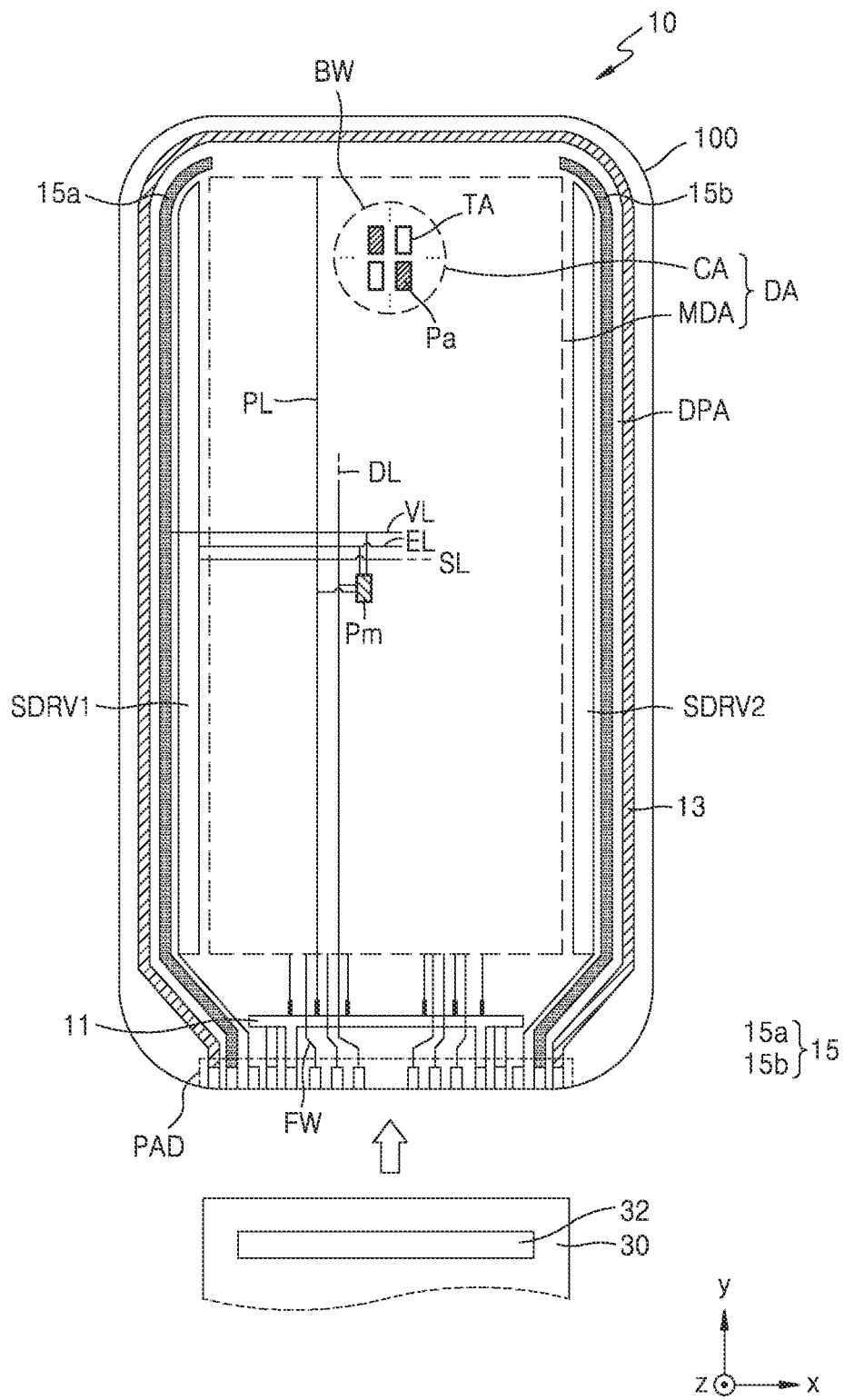
FIG. 3 is a plan view of a display panel according to some example embodiments.

FIG. 3 is a plan view of the display panel 10 according to some example embodiments.

Referring to FIG. 3, various elements constituting the display panel 10 are arranged on the substrate 100. The substrate 100 includes the display area DA and the peripheral area DPA surrounding (e.g., outside a footprint of) the display area DA. The display area DA includes the main display area MDA and the component area CA, a main image being displayed in the main display area MDA, an auxiliary image being displayed in the component area CA, and the component area CA including the transmission area TA. An auxiliary image may constitute one entire image in cooperation with a main image (e.g., an image that corresponds to a portion of the main image, for example, having a relatively lower resolution at the location of the component area CA) or include an image independent of the main image.

A plurality of main sub-pixels Pm are arranged in the main display area MDA. Each of the main sub-pixels Pm may include a display element such as an organic light-emitting diode OLED. Each of the main sub-pixels Pm may emit, for example, red, green, blue, or white light. The main display area MDA may be covered by the sealing member and protected from external air or moisture, etc.

The component area CA may be arranged on one side of the main display area MDA as described above, or arranged inside the display area DA and surrounded by the main display area MDA. The plurality of auxiliary sub-pixels Pa are arranged in the component area CA. Each of the plurality of auxiliary sub-pixels Pa may include a display element such as an organic light-emitting diode OLED. Each of the auxiliary sub-pixels Pa may emit, for example, red, green, blue, or white light. The component area CA may be covered by the sealing member and protected from external air or moisture, etc.

The component area CA may include the transmission area TA. The transmission area TA may surround the plurality of auxiliary sub-pixels Pa. Alternatively, the transmission area TA may be arranged in a lattice configuration with the plurality of auxiliary sub-pixels Pa.

Because the component area CA includes the transmission area TA, the resolution of the component area CA may be less than the resolution of the main display area MDA. For example, the resolution of the component area CA may be about ½, ⅜, ⅓, ¼, ⅖, ⅛, ⅑, ¹⁄₁₆, etc. of the resolution of the main display area MDA. For example, the resolution of the main display area MDA may be about 400 ppi and the resolution of the component area CA may be about 200 ppi or about 100 ppi.

Each of pixel circuits configured to drive the main and auxiliary sub-pixels Pm and Pa may be electrically connected to outer circuits arranged in the peripheral area DPA. A first scan driving circuit SDRV1, a second scan driving circuit SDRV2, a terminal portion PAD, a driving voltage supply line 11, a common voltage supply line 13, and an initialization voltage supply line 15 may be arranged in the peripheral area DPA.

The first scan driving circuit SDRV1 may apply a scan signal to each of the pixel circuits configured to drive the main and auxiliary sub-pixels Pm and Pa through a scan line SL. The first scan driving circuit SDRV1 may apply an emission control signal to each pixel circuit through an emission control line EL. The second scan driving circuit SDRV2 may be arranged on an opposite side of the first scan driving circuit SDRV1 with the main display area MDA therebetween and may be approximately parallel to the first scan driving circuit SDRV1.

Some of the pixel circuits of the main sub-pixels Pm in the main display area MDA may be electrically connected to the first scan driving circuit SDRV1, and the rest of the pixel circuits may be electrically connected to the second scan driving circuit SDRV2. Some of the pixel circuits of the auxiliary sub-pixels Pa in the component area CA may be electrically connected to the first scan driving circuit SDRV1, and the rest of the pixel circuits may be electrically connected to the second scan driving circuit SDRV2. According to some example embodiments, the second scan driving circuit SDRV2 may be omitted.

The terminal portion PAD may be arranged on one side of the substrate 100. The terminal portion PAD may be exposed by not being covered by an insulating layer and may be connected to a display circuit board 30. A display driver 32 may be arranged on the display circuit board 30.

The display driver 32 may generate a control signal transferred to the first scan driving circuit SDRV1 and the second scan driving circuit SDRV2. The display driver 32 generates a data signal. The generated data signal may be transferred to the pixel circuits of the main and auxiliary sub-pixels Pm and Pa through a fan-out line FW and the data line DL connected to the fan-out line FW.

The display driver 32 may supply a driving voltage ELVDD to the driving voltage supply line 11 and supply a common voltage ELVSS to the common voltage supply line 13. The driving voltage ELVDD may be applied to the pixel circuits of the main and auxiliary sub-pixels Pm and Pa through the driving voltage line PL connected to the driving voltage supply line 11, and the common voltage ELVSS may be applied to an opposite electrode of the display elements through the common voltage supply line 13. The display driver 32 may supply an initialization voltage to the initialization voltage supply line 15. The initialization voltage may be applied to the pixel circuits of the main and auxiliary sub-pixels Pm and Pa through an initialization voltage line VL.

The driving voltage supply line 11 may be connected to the terminal portion PAD and may extend in an x-direction from below the main display area MDA. The common voltage supply line 13 may be connected to the terminal portion PAD and have a loop shape having one open side to partially surround the main display area MDA.

The initialization voltage supply line 15 may include a first initialization voltage supply line 15a and a second initialization voltage supply line 15b. The first initialization voltage supply line 15a and the second initialization voltage supply line 15b may be connected to the terminal portion PAD and may extend in a y-direction in a shape at least surrounding the left and right of the main display area MDA. The first initialization voltage supply line 15a and the second initialization voltage supply line 15b may be apart from each other with the display area DA therebetween.

As described below with reference to FIGS. 8 to 10, the initialization voltage line VL may include a first initialization voltage line VL1 and a second initialization voltage line VL2. In this case, an initialization voltage supply line connected to the first initialization voltage line VL1, and an initialization voltage supply line connected to the second initialization voltage line VL2 may be provided separately. The initialization voltage supply line connected to the first initialization voltage line VL1, and the initialization voltage supply line connected to the second initialization voltage line VL2 may respectively include the first initialization voltage supply line 15a and the second initialization voltage supply line 15b.

Figure 4:
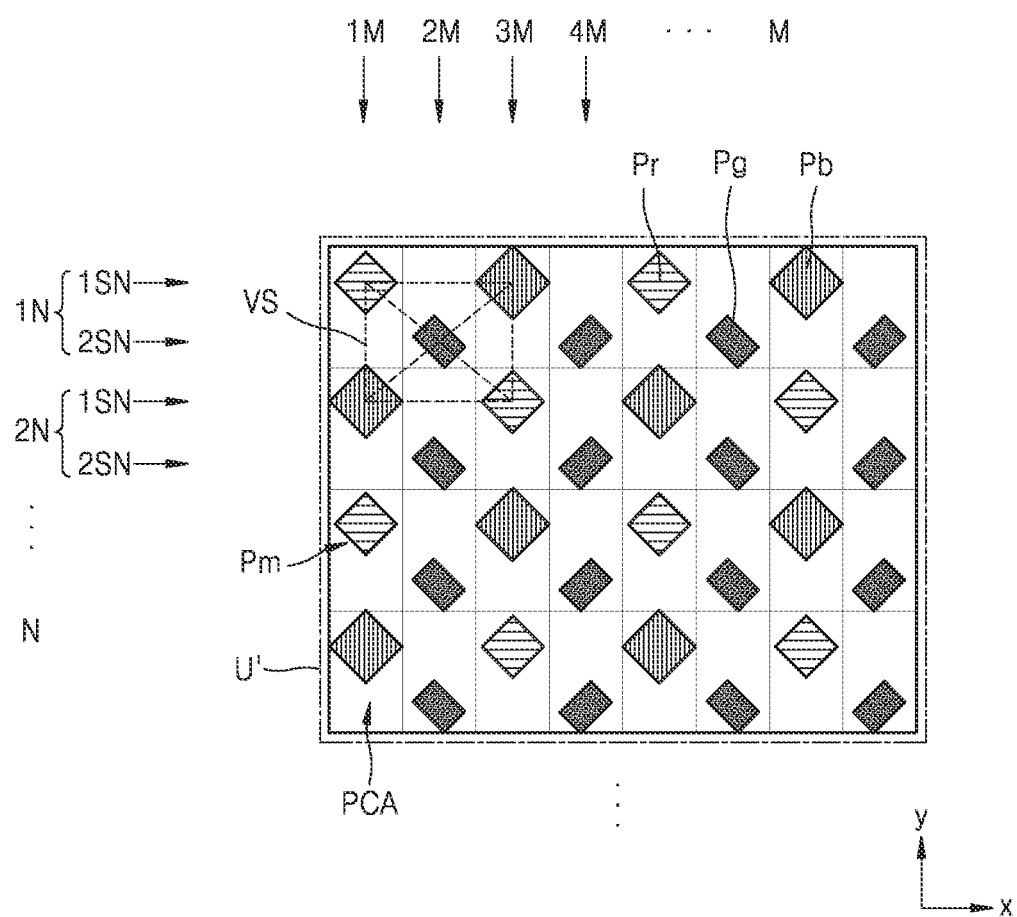
FIG. 4 is an arrangement view of a pixel arrangement structure in a main display area according to some example embodiments.

FIG. 4 is an arrangement view of a pixel arrangement structure in the main display area MDA according to some example embodiments.

Referring to FIG. 4, a plurality of main sub-pixels Pm may be arranged in the main display area MDA. In the present specification, a sub-pixel is a minimum unit configured to display an image and denotes an emission area. In the case where an organic light-emitting diode is employed as a display element, an emission area of a sub-pixel may be defined by an emission layer or an opening of a pixel-defining layer. This is described in more detail below.

The main display area MDA of FIG. 4 may be divided into circuit areas PCA in which a pixel circuit connected to a main sub-pixel Pm is arranged.

The main sub-pixels Pm may include a red sub-pixel Pr, a green sub-pixel Pg, and a blue sub-pixel Pb. A red sub-pixel Pr, a green sub-pixel Pg, and a blue sub-pixel Pb may respectively implement red color, green color, and blue color.

Red sub-pixels Pr and blue sub-pixels Pb are alternately arranged on a first sub-row 1SN of each of rows 1N, 2N, . . . , N. Green sub-pixels Pg are apart from each other on a second sub-row 2SN that neighbors the first sub-row 1SN. Such a pixel arrangement may be repeated up to an N-th row. In this case, the blue sub-pixel Pb and the red sub-pixel Pr may be greater than the green sub-pixel Pg. The red sub-pixels Pr and the blue sub-pixels Pb on the first sub-row 1SN and the green sub-pixels Pg on the second sub-row 2SN may be alternately arranged with each other. Therefore, red sub-pixels Pr and blue sub-pixels Pb are alternately arranged on a first column 1M, and green sub-pixels Pg are apart from each other on a neighboring second column 2M. Blue sub-pixels Pb and red sub-pixels Pr are alternately arranged on a neighboring third column 3M, and green sub-pixels Pg are apart from each other on a neighboring fourth column 4M. Such a pixel arrangement may be repeated up to an M-th column.

Such a pixel arrangement structure may be expressed differently, in which: red sub-pixels Pr are respectively arranged on first and third vertexes among the vertexes of a virtual quadrangle VS with a green sub-pixel Pg centered at the center of the quadrangle, and blue sub-pixels Pb are respectively arranged on second and fourth vertexes, which are the rest of the vertexes. In this case, the virtual quadrangle VS may be variously modified to a rectangle, a rhombus, a square, etc.

Such a pixel arrangement structure is referred to as a pentile matrix structure or a pentile structure. The pentile matrix structure may implement a relatively high resolution image with a relatively small number of pixels by applying rendering that expresses colors by sharing neighboring pixels.

Though it is shown in FIG. 4 that a plurality of main sub-pixels Pm are arranged in a pentile structure, the embodiments according to the present disclosure are not limited thereto. For example, a plurality of main sub-pixels Pm may be arranged in various configurations such as a stripe structure, a mosaic arrangement structure, a delta arrangement structure, etc., or any other suitable pixel arrangement or structure according to the design of the display device 1.

Figure 5A:
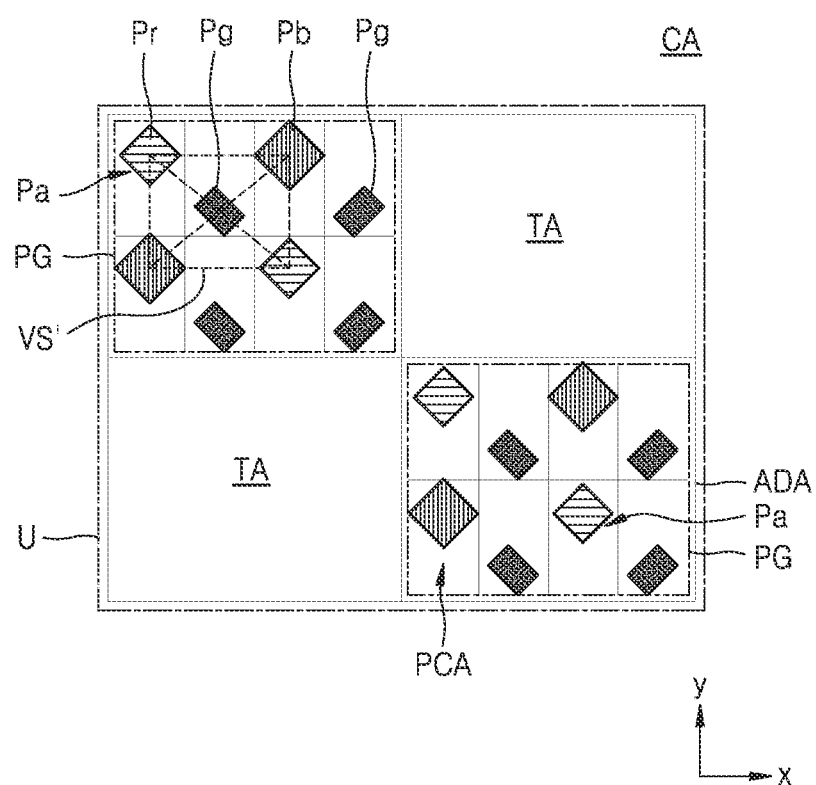
FIGS. 5A and 5B are arrangement views of a sub-pixel arrangement structure in a component area according to some example embodiments.
Figure 5B:
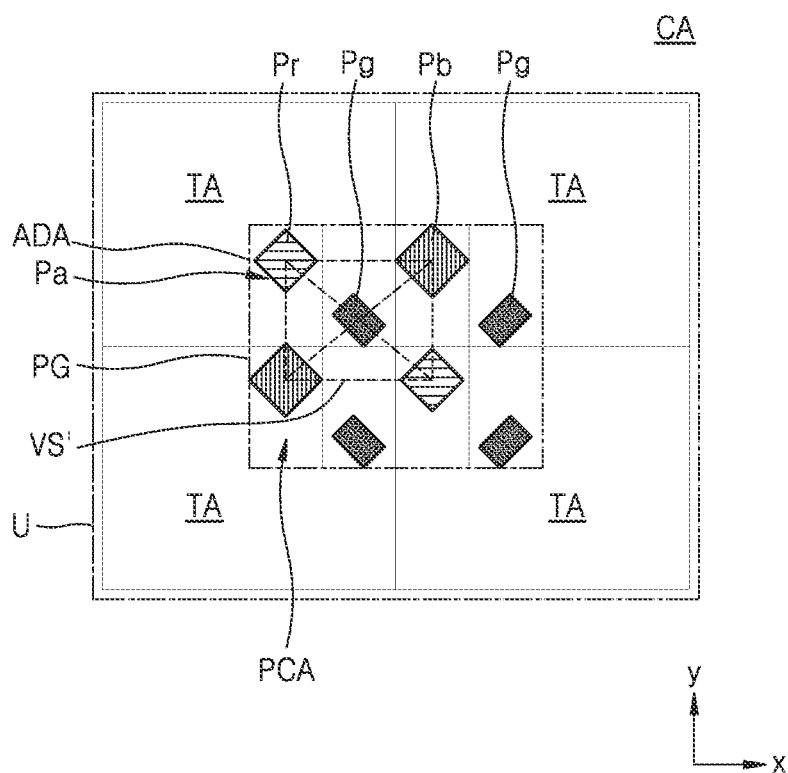

FIGS. 5A and 5B are arrangement views of a sub-pixel arrangement structure in the component area CA according to some example embodiments.

Referring to FIG. 5A, a plurality of auxiliary sub-pixels Pa may be arranged in the component area CA. Each of the plurality of auxiliary sub-pixels Pa may emit red, green, blue, or white light.

The component area CA may include the sub-pixel area ADA and the transmission area TA, a pixel group PG being arranged in the sub-pixel area ADA, and the pixel group PG including at least one auxiliary sub-pixel Pa. The sub-pixel areas ADA and the transmission areas TA are alternately arranged in the x-direction and the y-direction and arranged, for example, in a lattice configuration. In this case, the component area CA may include a plurality of sub-pixel areas ADA and a plurality of transmission areas TA. The sub-pixel area ADA may be divided into circuit areas PCA in which a pixel circuit connected to an auxiliary sub-pixel Pa is arranged.

The pixel group PG may be defined as a sub-pixel aggregation in which a plurality of auxiliary sub-pixels Pa are bound on a preset basis. For example, as shown in FIG. 5A, a pixel group PG may include eight auxiliary sub-pixels Pa arranged in a pentile structure. That is, a pixel group PG may include two red sub-pixels Pr, four green sub-pixels Pg, and two blue sub-pixels Pb.

A basic unit U may be repeatedly arranged in the component area CA in the x-direction and the y-direction, a preset number of pixel groups PG and a preset number of transmission areas TA being bound in the basic unit U. In FIG. 5A, the basic unit U may have a shape in which two pixel groups PG and two transmission areas TA are bound in a quadrangle, the two areas TA surrounding the two pixel groups PG. The basic unit U includes divided shapes that are repeated and does not mean disconnection of the configuration.

As shown in FIG. 4, a corresponding unit U' may be set in the main display area MDA, the corresponding unit U' having the same area as the basic unit U. In this case, the number of main sub-pixels Pm included in the corresponding unit U' may be greater than the number of auxiliary sub-pixels Pa included in the basic unit U.

Similar to the arrangement of the main sub-pixels Pm in the main display area MDA, four auxiliary sub-pixels Pa may be respectively arranged at the vertexes of a virtual quadrangle VS'. The resolution of the component area CA is about ½ of the resolution of the main display area MDA. The pixel arrangement structure of the component area CA is referred to as a ½ pentile structure. The number of auxiliary sub-pixels Pa or the arrangement structure of the auxiliary sub-pixels Pa included in the pixel group PG may be modified depending on the resolution of the component area CA.

Referring to FIG. 5B, the pixel arrangement structure of the component area CA may include a ¼ pentile structure. According to some example embodiments, the pixel group PG includes eight auxiliary sub-pixels Pa arranged in a pentile structure, but the basic unit U may include only one pixel group PG. The rest of the regions of the basic unit U may include the transmission area TA. Therefore, the number of auxiliary sub-pixels Pa and the number of main sub-pixels Pm per same area may be provided at a ratio of 1:4. In this case, one pixel group PG may be surrounded by the transmission area TA.

Though it is shown in FIGS. 5A and 5B that a plurality of auxiliary sub-pixels Pa are arranged in a pentile structure, the embodiments according to the present disclosure are not limited thereto. For example, a plurality of auxiliary sub-pixels Pa may be arranged in various configurations such as a stripe structure, a mosaic arrangement structure, a delta arrangement structure, etc.

In addition, though it is shown in FIGS. 5A and 5B that the size of the auxiliary sub-pixel Pa is the same as the size of the main sub-pixel Pm of FIG. 4, the embodiments according to the present disclosure are not limited thereto. The size of the auxiliary sub-pixel Pa may be greater than the size of the main sub-pixel Pm representing the same color. For example, the size of a blue sub-pixel Pb of an auxiliary sub-pixel Pa, may be greater than the size of a blue sub-pixel Pb of a main sub-pixel Pm. A difference in the size may be designed by taking into account a difference in brightness and/or resolution of the component area CA and the main display area MDA.

Figure 6:
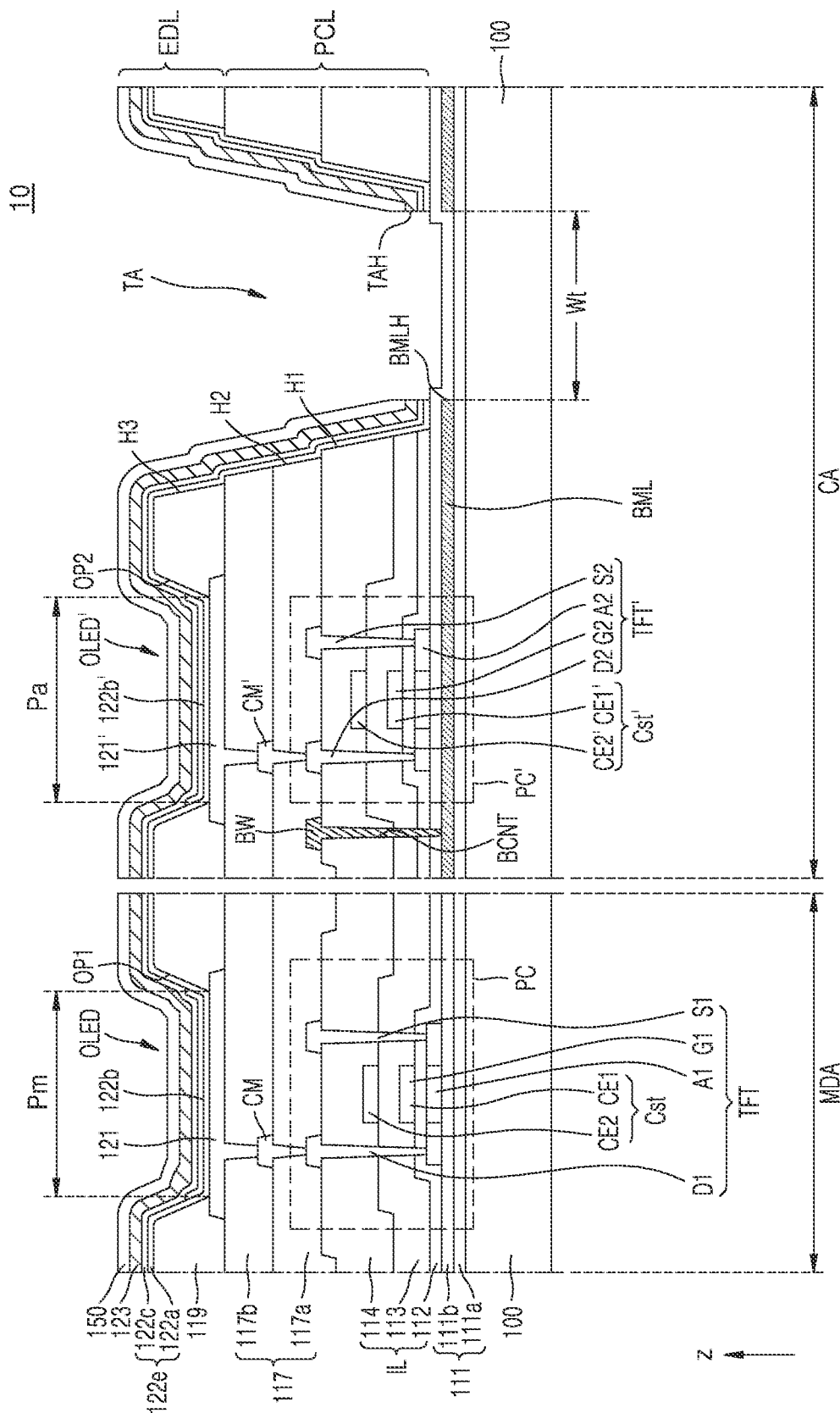
FIG. 6 is a cross-sectional view of a portion of the display panel according to some example embodiments and shows a main display area and a component area.

FIG. 6 is a cross-sectional view of a portion of the display panel 10 according to some example embodiments and shows the main display area MDA and the component area CA.

Referring to FIG. 6, the display panel 10 includes the main display area MDA and the component area CA. Main sub-pixels Pm are arranged in the main display area MDA, and auxiliary sub-pixels Pa and the transmission areas TA are arranged in the component area CA. A main pixel circuit PC and a main organic light-emitting diode OLED, which is a display element, may be arranged in the main display area MDA, the main pixel circuit PC including a main thin film transistor TFT and a main capacitor Cst, and the main light-emitting diode OLED being connected to the main pixel circuit PC. An auxiliary pixel circuit PC' and an auxiliary organic light-emitting diode OLED', which is a display element, may be arranged in the component area CA, the auxiliary pixel circuit PC' including an auxiliary thin film transistor TFT' and an auxiliary capacitor Cst', and the auxiliary organic light-emitting diode OLED' being connected to the auxiliary pixel circuit PC'.

Though an organic light-emitting diode is employed as a display element as an example in the example embodiments, an inorganic light-emitting diode or a quantum-dot light-emitting diode may be employed as a display element according to some example embodiments.

A structure in which elements of the display panel 10 are stacked is described below. The display panel 10 may include the substrate 100, a buffer layer 111, the circuit layer PCL, and the display element layer EDL. As shown in FIG. 2, the sealing member ENCM and the optical functional layer OFL may be further stacked on the display element layer EDL.

The substrate 100 may include an insulating material such as glass, quartz, and a polymer resin. The substrate 100 may include a rigid substrate or a flexible substrate that is bendable, foldable, and rollable.

The buffer layer 111 may be arranged on the substrate 100 to reduce or block the penetration of foreign substances or external air from below the substrate 100 and may provide a flat surface on the substrate 100. The buffer layer 111 may include an inorganic material such as oxide or nitride, an organic material, or an organic/inorganic composite material and include a single layer or a multi-layer including an inorganic material and an organic material. A barrier layer may be further arranged between the substrate 100 and the buffer layer 111, the barrier layer blocking the penetration of external air. According to some example embodiments, the buffer layer 111 may include silicon oxide ($SiO_x$) or silicon nitride ($SiN_x$). The buffer layer 111 may have a structure in which a first buffer layer 111a and a second buffer layer 111b are stacked.

A bottom metal layer BML may be between the first buffer layer 111a and the second buffer layer 111b in the component area CA. According to some example embodiments, the bottom metal layer BML may be between the substrate 100 and the first buffer layer 111a. The bottom metal layer BML may be arranged below the auxiliary pixel circuit PC' to prevent or reduce the characteristic of the auxiliary thin film transistor TFT' being deteriorated by light emitted from a component, etc. In addition, the bottom metal layer BML may prevent or reduce light emitted from a component or received by the component being diffracted through a narrow gap between wirings connected to the auxiliary pixel circuit PC'. According to some example embodiments, there is no bottom metal layer BML in the transmission area TA.

In addition, the bottom metal layer BML may be connected to a bias line BW on a different layer through a contact hole. The bottom metal layer BML may receive a constant voltage or signal from the bias line BW. For example, the bottom metal layer BML may receive a bias voltage. A difference in the brightness of the component area CA and the main display area MDA depending on a process distribution may be adjusted by adjusting a bias voltage. In addition, as the bias voltage is applied to the bottom metal layer BML, the auxiliary thin film transistor TFT' may be embodied as a double-gate transistor including two gate electrodes facing each other with a semiconductor layer therebetween and thus the characteristic of the auxiliary thin film transistor TFT' may be adjusted.

The bottom metal layer BML may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The bottom metal layer BML may include a single layer or a multi-layer including the above materials.

The pixel circuit layer PCL may be arranged on the buffer layer 111 and may include the pixel circuits, that is, the main and auxiliary pixel circuits PC and PC', a first gate insulating layer 112, a second gate insulating layer 113, an interlayer insulating layer 115, and a planarization layer 117.

The main thin film transistor TFT and the auxiliary thin film transistor TFT' may be arranged over the buffer layer 111. The main thin film transistor TFT includes a first semiconductor layer A1, a first gate electrode G1, a first source electrode S1, and a first drain electrode D1. The auxiliary thin film transistor TFT' may include a second semiconductor layer A2, a second gate electrode G2, a second source electrode S2, and a second drain electrode D2. The main thin film transistor TFT may be connected to the main organic light-emitting diode OLED to drive the organic light-emitting diode OLED. The auxiliary thin film transistor TFT' may be connected to the auxiliary organic light-emitting diode OLED' to drive the auxiliary organic light-emitting diode OLED'.

The first semiconductor layer A1 and the second semiconductor layer A2 may be arranged on the buffer layer 111 and may include polycrystalline silicon. According to some example embodiments, the first semiconductor layer A1 and the second semiconductor layer A2 may include amorphous silicon. According to some example embodiments, the first semiconductor layer A1 and the second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). Each of the first semiconductor layer A1 and the second semiconductor layer A2 may include a channel region, a source region, and a drain region, the source region and the drain region being doped with impurities.

The second semiconductor layer A2 may overlap the bottom metal layer BML with the second buffer layer 111b therebetween. According to some example embodiments, the width of the second semiconductor layer A2 may be less than the width of the bottom metal layer BML and accordingly, in a direction perpendicular to the substrate 100, the second semiconductor layer A2 may entirely overlap the bottom metal layer BML.

The first gate insulating layer 112 may cover the first semiconductor layer A1 and the second semiconductor layer A2. The first gate insulating layer 112 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multi-layer including the above inorganic insulating material.

The first gate electrode G1 and the second gate electrode G2 are arranged on the first gate insulating layer 112 to respectively overlap the first semiconductor layer A1 and the second semiconductor layer A2. The first gate electrode G1 and the second gate electrode G2 may include at least one of molybdenum (Mo), aluminum (Al), copper (Cu), or titanium (Ti) and include a single layer or a multi-layer. For example, the first gate electrode G1 and the second gate electrode G2 may include a single Mo layer.

The second gate insulating layer 113 may cover the first gate electrode G1 and the second gate electrode G2. The second gate insulating layer 113 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multi-layer including the above inorganic insulating material.

A first top electrode CE2 of the main capacitor Cst and a second top electrode CE2' of an auxiliary capacitor Cst' may be arranged on the second gate insulating layer 113.

The first top electrode CE2 may overlap the first gate electrode G1 therebelow in the main display area MDA. The first gate electrode G1 and the first top electrode CE2 overlapping each other with the second gate insulating layer 113 therebetween may constitute the main capacitor Cst. The first gate electrode G1 may serve as a first bottom electrode CE1 of the main capacitor Cst.

The second top electrode CE2' may overlap the second gate electrode G2 therebelow in the component area CA. The second gate electrode G2 and the second top electrode CE2' overlapping each other with the second gate insulating layer 113 therebetween may constitute the auxiliary capacitor Cst'. The second gate electrode G2 may serve as a second bottom electrode CE1' of the auxiliary capacitor Cst'.

The first top electrode CE2 and the second top electrode CE2' may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

An interlayer insulating layer 114 may cover the first top electrode CE2 and the second top electrode CE2'. The interlayer insulating layer 114 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the above inorganic insulating material.

Assuming that the first gate insulating layer 112, the second gate insulating layer 113, and the interlayer insulating layer 114 are collectively referred to as an inorganic insulating layer IL, the inorganic insulating layer IL may include a first hole H1 corresponding to the transmission area TA. The first hole H1 may expose a portion of the top surface of the buffer layer 111 or the substrate 100. The first hole H1 may include an opening of the first gate insulating layer 112, an opening of the second gate insulating layer 113, and an opening of the interlayer insulating layer 114 each corresponding to the transmission area TA and overlapping one another. These openings may be respectively formed through separate processes or simultaneously formed through the same process. In the case where these openings are formed through separate processes, the inner surface of the first hole H1 may not be smooth and may have a stair-like step difference.

According to some example embodiments, the inorganic insulating layer IL may include a groove, not the first hole H1 exposing the buffer layer 111. Alternatively, the inorganic insulating layer IL may not have the first hole H1 or the groove corresponding to the transmission area TA. Because the inorganic insulating layer IL includes an inorganic insulating material having an excellent light transmittance, even though the inorganic insulating layer IL does not include a hole or groove corresponding to the transmission area TA, the component 40 (see FIG. 2) may transmit/receive a sufficient amount of light.

The first and second source electrodes S1 and S2 and the first and second drain electrodes D1 and D2 may be arranged on the interlayer insulating layer 114. The first and second source electrodes S1 and S2 and the first and second drain electrodes D1 and D2 may include a conductive material including molybdenum (Mo), aluminum (Al), copper (Cu), and titanium (Ti) and include a single layer or a multi-layer including the above materials. According to some example embodiments, the first and second source electrodes S1 and S2 and the first and second drain electrodes D1 and D2 may have a multi-layered structure of Ti/Al/Ti.

The planarization layer 117 may be arranged to cover the first and second source electrodes S1 and S2 and the first and second drain electrodes D1 and D2. The planarization layer 117 may have a flat top surface such that a first pixel electrode 121 and a second pixel electrode 121' arranged on the planarization layer 117 are formed flat.

The planarization layer 117 may include an organic material or an inorganic material and include a single-layered structure or a multi-layered structure. The planarization layer 117 may include a first planarization layer 117a and a second planarization layer 117b. Accordingly, because a conductive pattern such as wirings may be formed between the first planarization layer 117a and the second planarization layer 117b, such a structure is advantageous in high integration.

The planarization layer 117 may include a general-purpose polymer such asbenzocyclobutene (BCB), polyimide, hexamethyldisiloxane (HMDSO), polymethylmethacrylate (PMMA) or polystyrene(PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. The planarization layer 117 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). To provide a flat top surface while the planarization layer 117 is formed, after the planarization layer 117 is formed, chemical mechanical polishing may be performed on a surface of the planarization layer 117.

As shown in FIG. 6, the bias line BW may be arranged on the inorganic insulating layer IL. According to some example embodiments, the bias line BW may be between the first planarization layer 117a and the second planarization layer 117b. The bias line BW may be electrically connected to the bottom metal layer BML through a contact hole, the bottom metal layer BML being arranged in the component area CA.

The first planarization layer 117a may be arranged to cover the pixel circuits, that is, the main and auxiliary pixel circuits PC and PC'. The second planarization layer 117b may be arranged on the first planarization layer 117a and may have a flat top surface such that the first and second pixel electrodes 121 and 121' are formed flat.

The main and auxiliary organic light-emitting diodes OLED and OLED' are arranged on the second planarization layer 117b. The first and second pixel electrodes 121 and 121' of the main and auxiliary organic light-emitting diodes OLED and OLED' may be respectively connected to the pixel circuits, that is, the main and auxiliary pixel circuits PC and PC' through connection metals CM and CM' on the first planarization layer 117a.

The connection metals CM and CM' may be between the first planarization layer 117a and the second planarization layer 117b. The connection metals CM and CM' may include a conductive material including molybdenum (Mo), aluminum (Al), copper (Cu), and titanium (Ti) and include a single layer or a multi-layer including the above materials. For example, the connection metals CM and CM' may have a multi-layered structure of Ti/Al/Ti.

The planarization layer 117 may include a second hole H2 corresponding to the transmission area TA. The second hole H2 may overlap the first hole H1. It is shown in FIG. 6 that the second hole H2 is larger than the first hole H1. According to some example embodiments, the planarization layer 117 may cover the edges of the first hole H1 of the inorganic insulating layer IL and accordingly, the area of the second hole H2 may be less than the area of the first hole H1.

The planarization layer 117 includes a via hole exposing one of the first source electrode S1 and the first drain electrode D1 of the main thin film transistor TFT. And the first pixel electrode 121 may be electrically connected to the main thin film transistor TFT by contacting the first source electrode S1 or the first drain electrode D1 through the contact hole. In addition, the planarization layer 117 includes a via hole exposing one of the second source electrode S2 and the second drain electrode D2 of the auxiliary thin film transistor TFT'. And the second pixel electrode 121' may be electrically connected to the auxiliary thin film transistor TFT' by contacting the second source electrode S2 or the second drain electrode D2 through the contact hole.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chrome (Cr), or compound thereof. For example, the first pixel electrode 121 and the second pixel electrode 121' may include a structure including ITO, IZO, ZnO, or $In_2O_3$ on/under the reflective layer. In this case, the first pixel electrode 121 and the second pixel electrode 121' may have a stacked structure of ITO/Ag/ITO.

A pixel-defining layer 119 covers the edges of the first pixel electrode 121 and the second pixel electrode 121' on the planarization layer 117 and may include a first opening OP1 and a second opening OP2 respectively exposing the portions of the first pixel electrode 121 and the second pixel electrode 121'. Emission areas of the main and auxiliary organic light-emitting diodes OLED and OLED', that is, the sizes and shapes of the main and auxiliary sub-pixels Pm and Pa, are defined by the first opening OP1 and the second opening OP2.

The pixel-defining layer 119 may prevent or reduce instances of an arc, etc. from occurring at the edges of the first pixel electrode 121 and the second pixel electrode 121' by increasing a distance between the edges of the first pixel electrode 121 and the second pixel electrode 121' and an opposite electrode 123 over the first pixel electrode 121 and the second pixel electrode 121'. The pixel-defining layer 119 may include an organic insulating material such as polyimide, polyamide, an acrylic resin, HMDSO, and a phenolic resin and be formed by using spin coating, etc.

The pixel-defining layer 119 may include a third hole H3 arranged in the transmission area TA. The third hole H3 may overlap the first hole H1 and the second hole H2. A light transmittance of the transmission area TA may be improved by the first to third holes H1, H2, and H3. Though it is shown in FIG. 6 that the buffer layer 111 is continuously arranged to correspond to the transmission area TA, the buffer layer 111 may include a hole located in the transmission area TA. A portion of the opposite electrode 123 described below may be arranged on the inner surfaces of the first to third holes H1, H2, and H3.

A first emission layer 122b and a second emission layer 122b' are arranged inside the first opening OP1 and the second opening OP2 of the pixel-defining layer 119, the first emission layer 122b and the second emission layer 122b' respectively corresponding to the first pixel electrode 121 and the second pixel electrode 121'. The first emission layer 122b and the second emission layer 122b' may include a polymer material or a low molecular weight material and emit red, green, blue, or white light.

An organic functional layer 122e may be arranged on and/or under the first emission layer 122b and the second emission layer 122b'. The organic functional layer 122e may include a first functional layer 122a and/or a second functional layer 122c. According to some example embodiments, the first functional layer 122a or the second functional layer 122c may be omitted.

The first functional layer 122a may be arranged under the first emission layer 122b and the second emission layer 122b'. The first functional layer 122a may include a single layer or a multi-layer including an organic material. The first functional layer 122a may include a hole transport layer (HTL), which has a single-layered structure. Alternatively, the first functional layer 122a may include a hole injection layer (HIL) and an HTL. The first functional layer 122a may be formed as one body to correspond to the main and auxiliary organic light-emitting diodes OLED and OLED' in the main display area MDA and the component area CA.

The second functional layer 122c may be arranged on the first emission layer 122b and the second emission layer 122b'. The second functional layer 122c may include a single layer or a multi-layer including an organic material. The second functional layer 122c may include an electron transport layer (ETL) and/or an electron injection layer (EIL). The second functional layer 122c may be formed as one body to correspond to the main and auxiliary organic light-emitting diodes OLED and OLED' in the main display area MDA and the component area CA.

The opposite electrode 123 is arranged on the second functional layer 122c. The opposite electrode 123 may include a conductive material having a small work function. For example, the opposite electrode 123 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 123 may include a layer including ITO, IZO, ZnO, or $In_2O_3$ on the (semi) transparent layer including the above material. The opposite electrode 123 may be formed as one body to correspond to the main and auxiliary organic light-emitting diodes OLED and OLED' in the main display area MDA and the component area CA.

The layers from the first pixel electrode 121 to the opposite electrode 123 formed in the main display area MDA may constitute the main organic light-emitting diode OLED. The layers from the first pixel electrode 121' to the opposite electrode 123 formed in the component area CA may constitute the auxiliary organic light-emitting diode OLED'.

A top layer 150 may be formed on the opposite electrode 123, the top layer 150 including an organic material. The top layer 150 may include a layer configured to protect the opposite electrode 123 and simultaneously increase a light-extraction efficiency. The top layer 150 may include an organic material having a higher refractive index than the opposite electrode 123. Alternatively, the top layer 150 may include a stack of layers having different refractive indexes. For example, the top layer 150 may include a stack of a high refractive index layer/a low refractive index layer/a high refractive index layer. In this case, the refractive index of the high refractive index layer may be 1.7 or more and the refractive index of the low refractive index layer may be 1.3 or less.

The top layer 150 may additionally include lithium fluoride (LiF). Alternatively, the top layer 150 may additionally include an inorganic insulating material such as silicon oxide ($SiO_x$) and silicon nitride ($SiN_x$).

The first functional layer 122a, the second functional layer 122c, the opposite electrode 123, and the top layer 150 may each include a transmission hole TAH corresponding to the transmission area TA. That is, Each of the first functional layer 122a, the second functional layer 122c, the opposite electrode 123, and the top layer 150 may include an opening corresponding to the transmission area TA. The areas of the openings may be substantially the same. For example, the area of the opening of the opposite electrode 123 may be substantially the same as the area of the transmission hole TAH.

When the transmission hole TAH corresponds to the transmission area TA, it may be understood that the transmission hole TAH overlaps the transmission area TA. In this case, the area of the transmission hole TAH may be less than the area of the first hole H1 formed in the inorganic insulating layer IL. For this, it is shown in FIG. 6 that a width Wt of the transmission hole TAH is less than the width of the first hole H1. Here, the area of the transmission hole TAH may be defined as the area of an opening having a smallest area among the openings constituting the transmission hole TAH. The area of the first hole H1 may be defined as the area of an opening having a smallest area among the openings constituting the first hole H1.

A portion of the opposite electrode 123 is removed from the transmission area TA due to the transmission hole TAH. Through this configuration, a light transmittance of the transmission area TA may be remarkably improved.

The bottom metal layer BML in the component area CA may be provided to correspond to the entire component area CA. In this case, the bottom metal layer BML may include a bottom hole BMLH overlapping the transmission area TA. According to some example embodiments, the shape and size of the transmission area TA may be defined by the shape and size of the bottom hole BMLH. The bottom metal layer BML may not be arranged in the main display area MDA.

Figure 7:
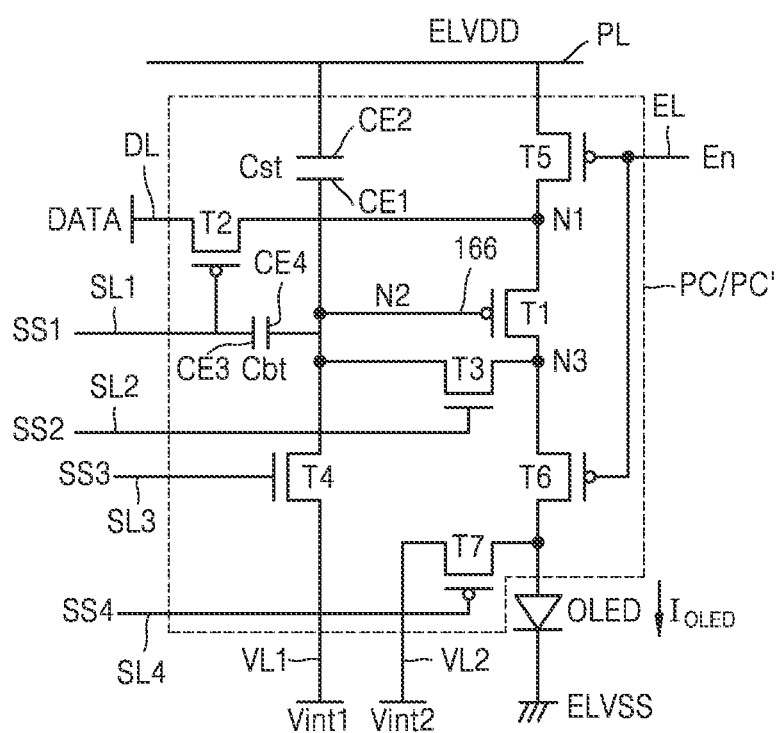
FIG. 7 is an equivalent circuit diagram of a pixel circuit driving a sub-pixel according to some example embodiments.

FIG. 7 is an equivalent circuit diagram of a pixel circuit PC driving a sub-pixel according to some example embodiments.

FIG. 7 shows the pixel circuit PC of the main sub-pixel Pm, and the pixel circuit PC' of the auxiliary sub-pixel Pa may be the same as or different from the pixel circuit PC of the main sub-pixel Pm. An embodiment below is described using an example in which the pixel circuit PC' of the auxiliary sub-pixel Pa is the same as the pixel circuit PC of the main sub-pixel Pm.

The pixel circuit PC may include first to seventh transistors T1, T2, T3, T4, T5, T6, and T7 and a first capacitor Cst and a second capacitor Cbt. The pixel circuit PC may be connected to a data line DL, a first scan line SL1, a second scan line SL2, a third scan line SL3, a fourth scan line SL4, and an emission control line EL. In addition, the pixel circuit PC may be connected to first and second initialization voltage lines VL1 and VL2 and a driving voltage line PL. The pixel circuit PC may be connected to an organic light-emitting diode OLED as a display element.

The driving voltage line PL may transfer a driving voltage ELVDD to the first transistor T1. The first initialization voltage line VL1 may transfer a first initialization voltage Vint1 to a second node N2, the first initialization voltage Vint1 initializing the first transistor T1. The second initialization voltage line VL2 may transfer a second initialization voltage Vint2 to the organic light-emitting diode OLED, the second initialization voltage Vint2 initializing the organic light-emitting diode OLED.

It is shown in FIG. 7 that the third transistor T3 and the fourth transistor T4 among the first to seventh transistors T1, T2, T3, T4, T5, T6, and T7 include n-channel metal oxide semiconductor field effect transistors (NMOS) and the rest of the transistors include p-channel metal oxide semiconductor field effect transistors (PMOS).

The first transistor T1 is connected to a first node N1 and a third node N3. The first transistor T1 is connected to the driving voltage line PL through the fifth transistor T5 and electrically connected to the organic light-emitting diode OLED through the sixth transistor T6. A gate electrode of the first transistor T1 is connected to the second node N2. The first transistor T1 serves as a driving transistor, receives a data signal DATA according to a switching operation of the second transistor T2, and supplies a driving current $I_{OLED}$ to the organic light-emitting diode OLED.

The second transistor T2 (a switching transistor) is connected to the data line DL and the first node N1. The second transistor T2 is connected to the driving voltage line PL through the fifth transistor T5. A gate electrode of the second transistor T2 is connected to the first scan line SL1. The second transistor T2 is turned on in response to a first scan signal SS1 transferred through the first scan line SL1 and performs a switching operation of transferring a data signal DATA transferred through the data line DL to the first node N1.

The third transistor T3 (a compensation transistor) is connected to the first node N1 and the third node N3. The third transistor T3 is connected to the organic light-emitting diode OLED through the sixth transistor T6. A gate electrode of the third transistor T3 is connected to a second scan line SL2. The third transistor T3 is turned on in response to a second scan signal SS2 transferred through the second scan line SL2 and diode-connects the first transistor T1. The second scan signal SS2 may include an inverted signal of a first scan signal SS1. The second scan signal SS2 may be applied at the same timing as the first scan signal SS1.

The fourth transistor T4 (a first initialization transistor) is connected to the second node N2 and the first initialization voltage line VL1. A gate electrode of the fourth transistor T4 is connected to a third scan line SL3. The fourth transistor T4 is turned on in response to a third scan signal SS3 transferred through the third scan line SL3 and initializes the voltage of the gate electrode of the first transistor T1 by transferring the first initialization voltage Vint1 from the first initialization voltage line VL1 to the gate electrode of the first transistor T1. A third scan signal SS3 may be applied at a timing prior to a first scan signal SS1.

The fifth transistor T5 (a first emission control transistor) is connected to the driving voltage line PL and the first node N1. The sixth transistor T6 (a second emission control transistor) is connected to the third node N3 and the organic light-emitting diode OLED. A gate electrode of each of the fifth transistor T5 and the sixth transistor T6 is connected to an emission control line EL, and the fifth transistor T5 and the sixth transistor T6 are simultaneously turned on in response to an emission control signal EM and form a current path such that the driving current $I_{OLED}$ flows from the driving voltage line PL to the organic light-emitting diode OLED.

A seventh transistor T7 (a second initialization transistor) is connected to the organic light-emitting diode OLED and the second initialization voltage line VL2. A gate electrode of the seventh transistor T7 is connected to the fourth scan line SL4. The seventh transistor T7 is turned on in response to a fourth scan signal SS4 transferred through the fourth scan line SL4 and initializes the organic light-emitting diode OLED by transferring a second initialization voltage Vint2 from the second initialization voltage line VL2 to the organic light-emitting diode OLED. A fourth scan signal SS4 may be applied at a timing prior to a first scan signal SS1 or applied at a timing later than a first scan signal SS1. According to some example embodiments, the seventh transistor T7 may be omitted.

The first capacitor Cst includes the first electrode CE1 and the second electrode CE2. The first electrode CE1 is connected to the first transistor T1, and the second electrode CE2 is connected to the driving voltage line PL. The first capacitor Cst serves as a storage capacitor and may maintain a voltage applied to the gate electrode of the first transistor T1 by storing and maintaining a voltage corresponding to a voltage difference between two opposite ends of the driving voltage line PL and the gate electrode of the first transistor T1.

The second capacitor Cbt includes a third electrode CE3 and a fourth electrode CE4. The third electrode CE3 is connected to the first scan line SL1 and the gate electrode of the second transistor T2. The fourth electrode CE4 is connected to the gate electrode of the first transistor T1 and the first electrode CE1 of the first capacitor Cst. The second capacitor Cbt serves as a boosting capacitor. In the case where a first scan signal SS1 of the first scan line SL1 is a voltage that turns off the second transistor T2, the second capacitor Cbt may reduce a voltage (a black voltage) that displays black by raising the voltage of the second node N2.

The organic light-emitting diode OLED includes a pixel electrode and an opposite electrode. The opposite electrode may receive a common voltage ELVSS. The organic light-emitting diode OLED displays an image by receiving the driving current $I_{OLED}$ from the first transistor T1 and emitting light.

The pixel circuit PC is not limited to the number of transistors, the number of capacitors, and the circuit design described with reference to FIG. 7 and may be variously modified.

Figure 8:
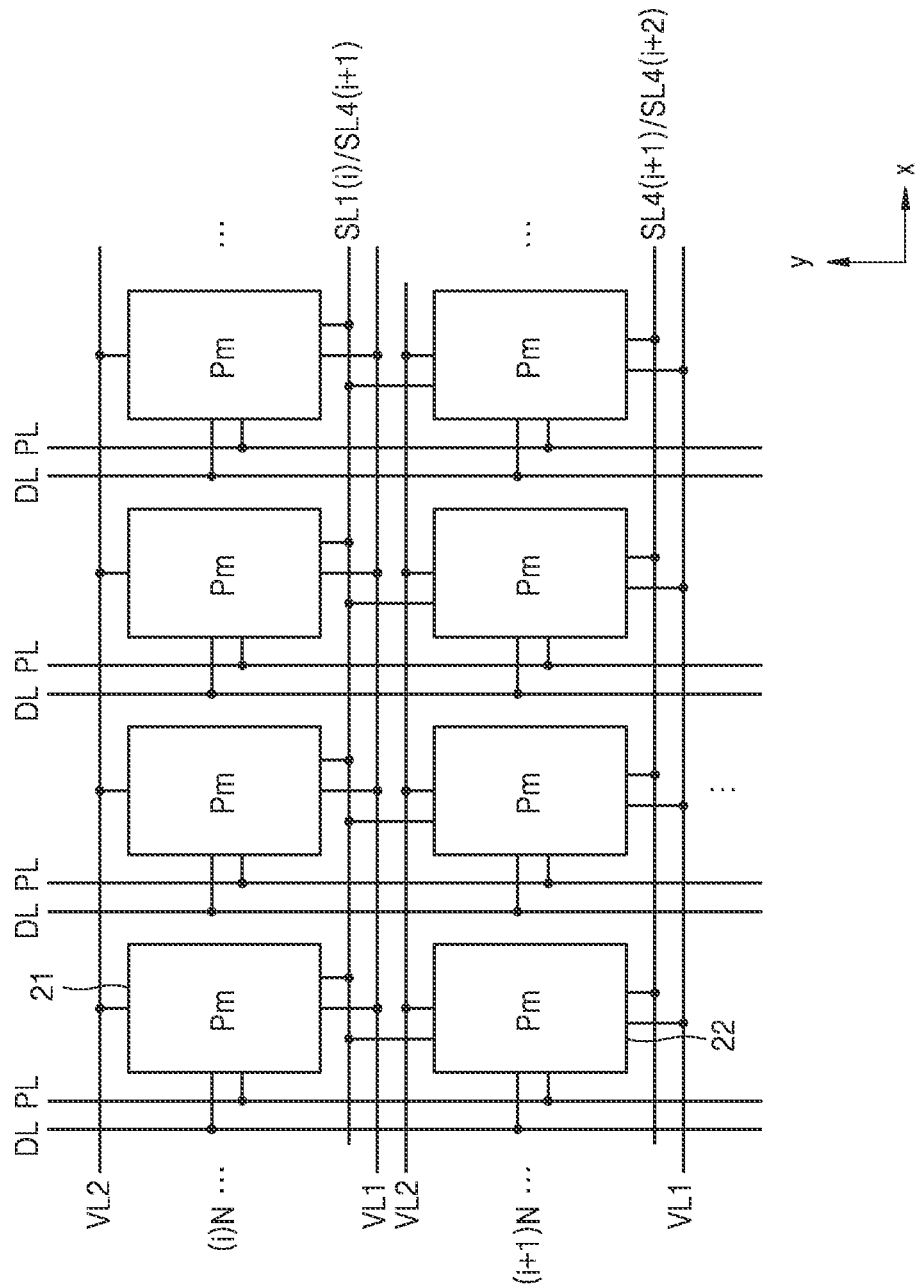
FIG. 8 is a view of the arrangement of wirings in the main display area according to some example embodiments.

FIG. 8 is a view of the arrangement of wirings in the main display area MDA according to some example embodiments.

The main sub-pixels Pm may be respectively connected to corresponding pixel circuits. Each pixel circuit may be connected to the first initialization voltage line VL1, the second initialization voltage line VL2, the first to fourth scan lines SL1, SL2, SL3, and SL4, the data line DL. The driving voltage line PL, the first initialization voltage line VL1 and the second initialization voltage line VL2, and the first to fourth scan lines SL1, SL2, SL3, and SL4 may extend in an x-direction (a first direction, a row direction), and the data line DL and the driving voltage line PL may extend in a y-direction (a second direction, a column direction). That is, each main sub-pixel Pm may be connected to the first initialization voltage line VL1, the second initialization voltage line VL2, the first to fourth scan lines SL1, SL2, SL3, and SL4, the data line DL, and the driving voltage line PL. The driving voltage line PL may be repeatedly arranged in the x-direction with a column interval in the main display area MDA. FIG. 8 shows only the first scan line SL1 and the fourth scan line SL4, for convenience of description.

The first scan line SL1 and the fourth scan line SL4 may be shared by two main sub-pixels Pm neighboring each other in the y-direction, that is, the two main sub-pixels Pm on neighboring rows and on the same column. For example, the first scan line SL1 (i) to which a main sub-pixel 21 on a (i)-th row ((i) N) is connected may be connected to a main sub-pixel 22 on a (i+1)-th row ((i+1) N). The first scan line SL1 (i) connected to the main sub-pixel 21 may serve as a fourth scan line SL4 (i+1) connected to the main sub-pixel 22, and the first scan line SL1 (i+1) connected to the main sub-pixel 22 may serve as a fourth scan line SL4 (i+2) connected to the main sub-pixel Pm arranged on the next row of the same column in the y-direction.

Figure 9:
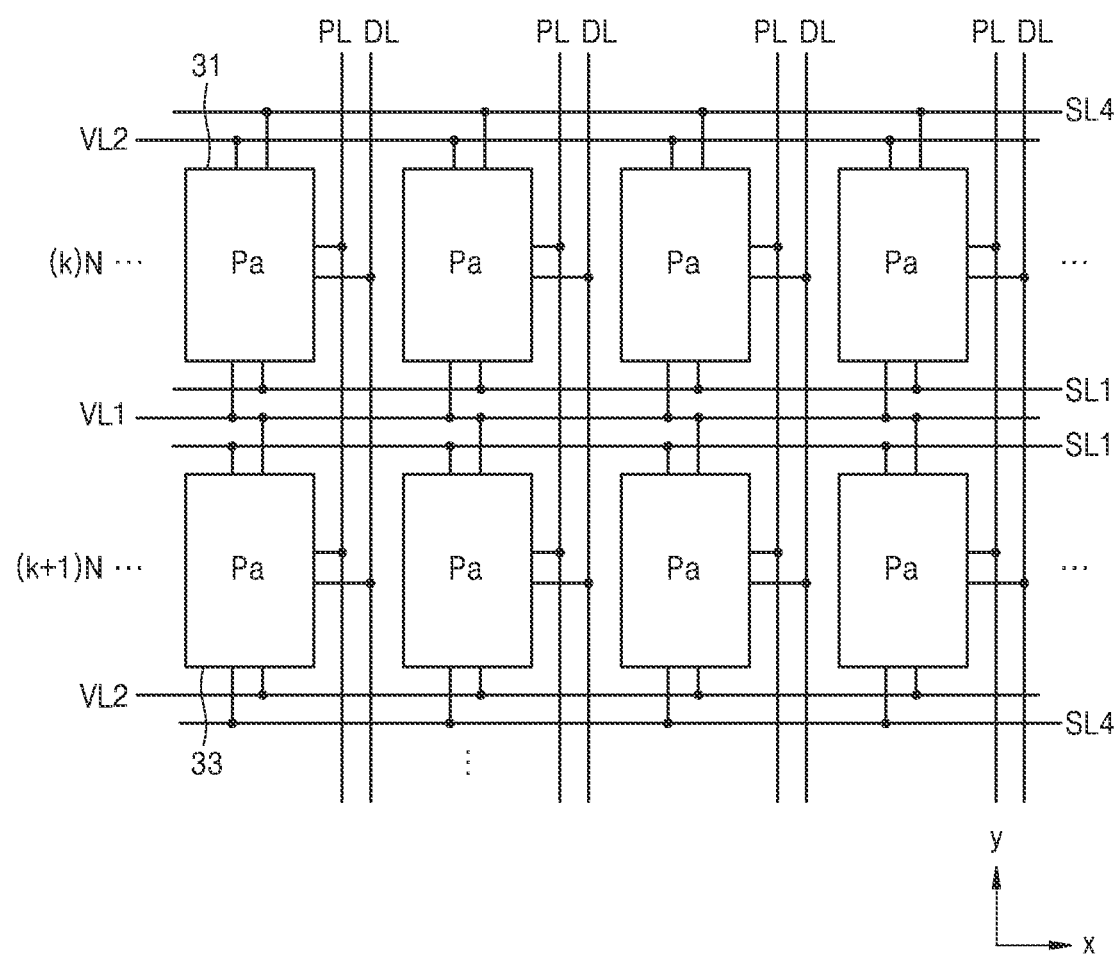
FIG. 9 is a view of the arrangement of wirings in the component area according to some example embodiments.

FIG. 9 is a view of the arrangement of wirings in the component area CA according to some example embodiments.

The auxiliary sub-pixels Pa may be respectively connected to corresponding pixel circuits. Each pixel circuit may be connected to the first to fourth scan lines SL1, SL2, SL3, and SL4, the first initialization voltage line VL1, the second initialization voltage line VL2, the data line DL, and the driving voltage line PL. The first to fourth scan lines SL1, SL2, SL3, and SL4, and the first initialization voltage line VL1 and the second initialization voltage line VL2 may extend in the x-direction, and the data line DL and the driving voltage line PL may extend in the y-direction. That is, each auxiliary sub-pixel may be connected to the first to fourth scan lines SL1, SL2, SL3, and SL4, the first initialization voltage line VL1, the second initialization voltage line VL2, the data line DL, and the driving voltage line PL. The driving voltage line PL may be repeatedly arranged with a row interval in the x-direction in the component area CA. FIG. 9 shows only the first scan line SL1 and the fourth scan line SL4, for convenience of description.

The first initialization voltage line VL1 may be between pixel circuits of two auxiliary sub-pixels Pa neighboring each other in the y-direction, that is, the two auxiliary sub-pixels Pa on the same column and on neighboring rows and accordingly be shared by the pixel circuits. For example, the first initialization voltage line VL1 may be between a k-th row (k)N and a (k+1)-th row (k+1)N, and a pixel circuit of the auxiliary sub-pixel 31 on the k-th row (k)N and a pixel circuit of the auxiliary sub-pixel 33 on the (k+1)-th row (k+1)N may be connected to the first initialization voltage line VL1. Pixel circuits of two auxiliary sub-pixels Pa may be symmetric with respect to the first initialization voltage line VL1. For example, a pixel circuit connected to the auxiliary sub-pixel 31 and a pixel circuit connected to the auxiliary sub-pixel 33 may be symmetric with respect to the first initialization voltage line VL1.

Because the first initialization voltage line VL1 is shared by pixel circuits connected to a pair of auxiliary sub-pixels Pa neighboring each other on the same column through a vertical symmetrical structure, the area in which the pixel circuits are arranged in the component area CA may be reduced. Accordingly, a light transmittance of the transmission area TA and a light transmittance of the entire component area CA may be improved.

The data line DL and the driving voltage line PL are arranged on the left of the main sub-pixel Pm in FIG. 8, and the data line DL and the driving voltage line PL are arranged on the right of the main sub-pixel Pm in FIG. 9. The embodiments according to the present disclosure are not limited thereto and the positions of the data line DL and the driving voltage line PL may be changed depending on the arrangement of elements constituting the pixel circuit.

Figure 10:
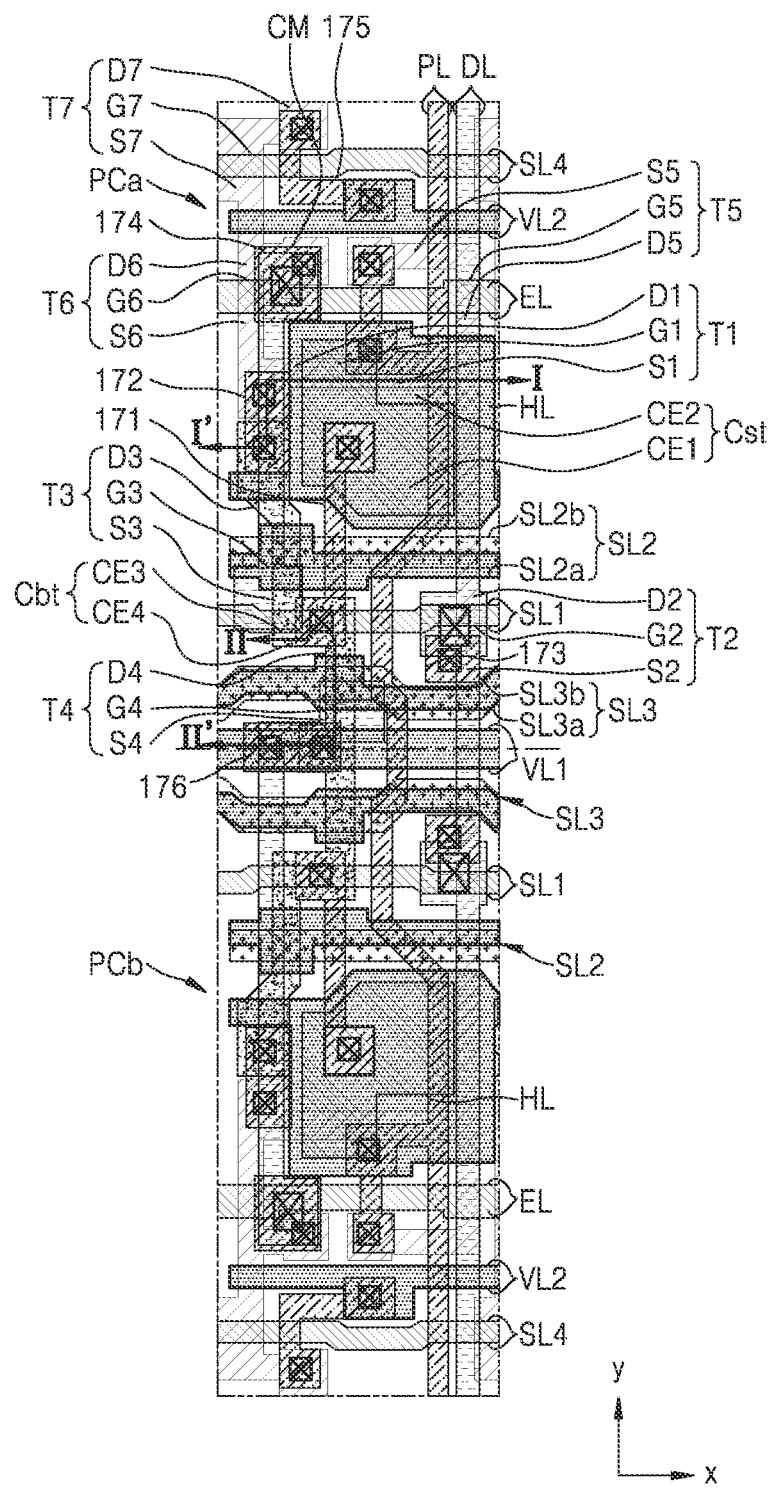
FIG. 10 is a plan view of a pixel circuit of an auxiliary sub-pixel according to some example embodiments.
Figure 11:
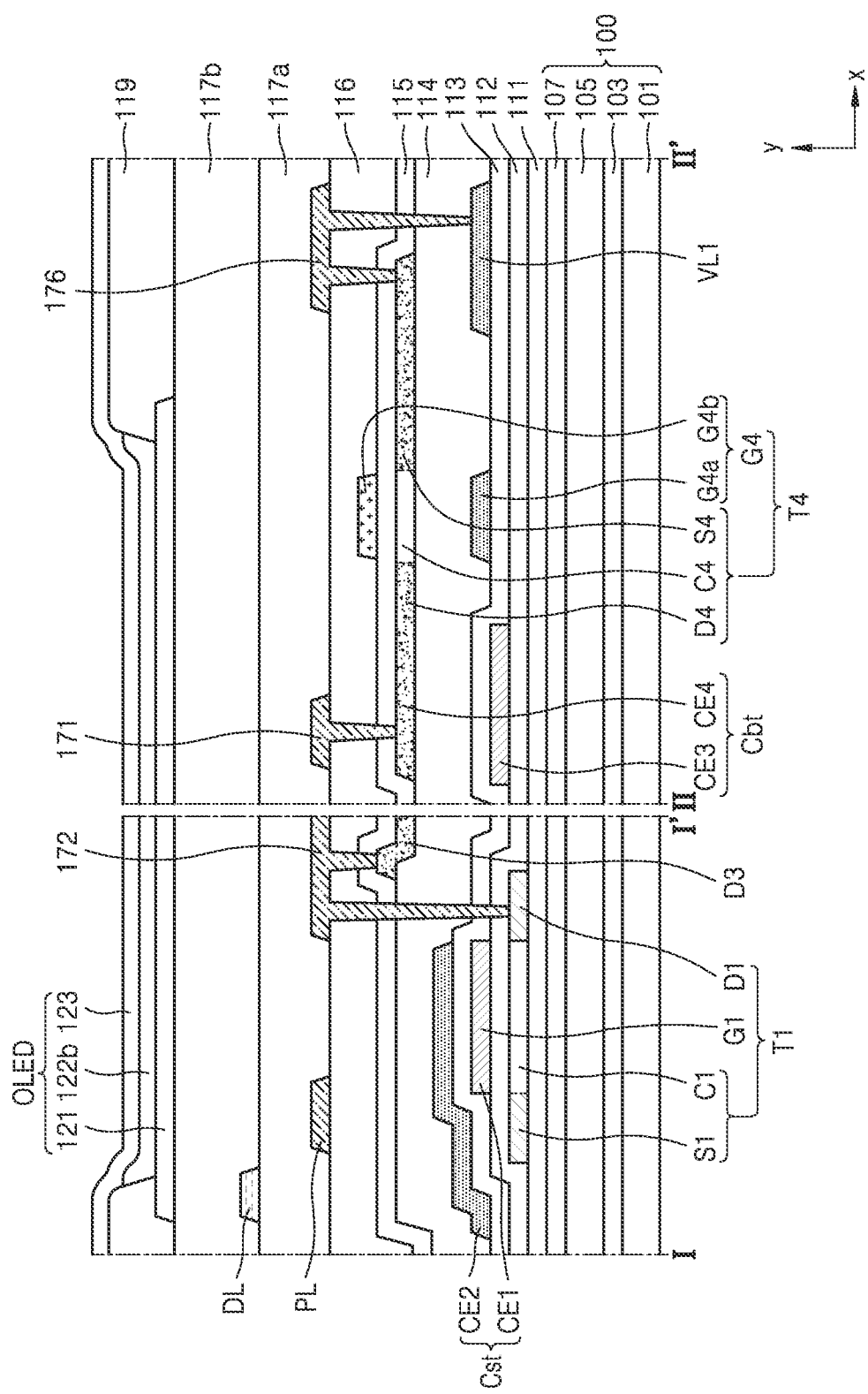
FIG. 11 is a cross-sectional view of the pixel circuit taken along the lines I-I' and II-II' of FIG. 10.

FIG. 10 is a plan view of a pixel circuit of an auxiliary sub-pixel according to some example embodiments. FIG. 11 is a cross-sectional view of the pixel circuit taken along the lines I-I' and II-II' of FIG. 10. Hereinafter, some detailed descriptions of the same elements as those of FIG. 6 may be omitted.

FIG. 10 shows a pair of pixel circuits arranged on the same column of neighboring rows in the component area CA shown in FIG. 9. A top pixel circuit PCa and a bottom pixel circuit PCb shown in FIG. 10 have a symmetric structure with respect to the first initialization voltage line VL1. For example, the arrangements of the first to seventh transistors T1, T2, T3, T4, T5, T6, and T7 and the first capacitors Cst and the second capacitors Cbt of the top pixel circuit PCa and the bottom pixel circuit PCb are symmetric with respect to the first initialization voltage line VL1. A distance between the first initialization voltage line VL1 and the second initialization voltage line VL2 connected to the top pixel circuit PCa may be the same as a distance between the first initialization voltage line VL1 and the second initialization voltage line VL2 connected to the bottom pixel circuit PCb.

The pixel circuit may be connected to the first scan line SL1, the second scan line SL2, the third scan line SL3, the fourth scan line SL4, the emission control line EL, the first initialization voltage line VL1, and the second initialization voltage line VL2 each extending in the x-direction. In addition, the pixel circuit may be connected to the data line DL and the driving voltage line PL each extending in the y-direction.

The pixel circuit may include the first transistor T1, the second transistor T2, the third transistor T3, the fourth transistor T4, the fifth transistor T5, the sixth transistor T6, the seventh transistor T7, the first capacitor Cst, and the second capacitor Cbt.

According to some example embodiments, the first transistor T1, the second transistor T2, the third transistor T3, the fourth transistor T4, the fifth transistor T5, the sixth transistor T6, and the seventh transistor T7 may each include a thin film transistor including a silicon semiconductor. The third transistor T3 and the fourth transistor T4 may include a thin film transistor including an oxide semiconductor. Hereinafter, the first to seventh transistors T1, T2, T3, T4, T5, T6, and T7 are respectively denoted by first to seventh thin film transistors T1, T2, T3, T4, T5, T6, and T7.

A first semiconductor layer may be arranged over the substrate 100, the first semiconductor layer including a silicon semiconductor. As another example, the buffer layer 111 may be formed on the substrate 100, and the first semiconductor layer may be formed on the buffer layer 111. As shown in FIG. 6, the buffer layer 111 may have a structure in which the first buffer layer 111a and the second buffer layer 111b are stacked. The first semiconductor layer may include polycrystalline silicon.

The substrate 100 may include glass, a ceramic material, a metal material, or a flexible or bendable material. In the case where the substrate 100 is flexible or bendable, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The substrate 100 may have a multi-layered structure. For example, the substrate 100 may have a structure in which a first base layer 101, a first barrier layer 103, a second base layer 105, and a second barrier layer 107 are sequentially stacked.

The first base layer 101 and the second base layer 103 may include the polymer resin. The first barrier layer 101 and the second barrier layer 103 prevent or reduce instances of external foreign substances or contaminants causing damage and may include a single layer or a multi-layer including an inorganic material such as silicon nitride ($SiN_x$) and silicon oxide ($SiO_x$).

Some regions of the first semiconductor layer may constitute the semiconductor layer of each of the first transistor T1, the second transistor T2, the fifth transistor T5, the sixth transistor T6, and the seventh transistor T7.

Semiconductor layers of the first transistor T1, the second transistor T2, the fifth transistor T5, the sixth transistor T6, and the seventh transistor T7 may respectively include channel regions, source regions S1, S2, S5, S6, and S7, and drain regions D1, D2, D5, D6, and D7, the source regions S1, S2, S5, S6, and S7 and the drain regions D1, D2, D5, D6, and D7 respectively being on two opposite sides of the channel regions. For example, the source region and the drain region may be doped with impurities and may include p-type impurities. The source region and the drain region may respectively correspond to a source electrode and a drain electrode. The source region and the drain region may be exchanged with each other depending on the characteristic of the transistor. Hereinafter, terms a 'source region' and a 'drain region' are used instead of a source electrode and a drain electrode. FIG. 11 shows a channel region C1 of the first thin film transistor T1 as an example.

The first gate insulating layer 112 is arranged on the first semiconductor layer. The first gate electrode G1 of the first thin film transistor T1, the first scan line SL1, the fourth scan line SL4, and the emission control line EL may be arranged on the first gate insulating layer 112. The first scan line SL1, the fourth scan line SL4, and the emission control line EL may extend in the x-direction and be apart from each other in the y-direction.

The gate electrode G1 of the first thin film transistor T1 includes an isolated pattern and overlaps the channel region C1 with the first gate insulating layer 112 therebetween.

A region of the first scan line SL1 overlapping the channel region of the second thin film transistor T2 may include the gate electrode G2 of the second thin film transistor T2. A region of the fourth scan line SL4 overlapping the channel region of the seventh thin film transistor T7 may include a gate electrode G7 of the seventh thin film transistor T7. Regions of the emission control line EL overlapping the channel regions of the fifth and sixth thin film transistors T5 and T6 may respectively include gate electrodes G5 and G6 of the fifth and sixth thin film transistors T5 and T6.

The second gate insulating layer 113 may be arranged on the gate electrode G1 of the first thin film transistor T1, the first scan line SL1, the fourth scan line SL4, and the emission control line EL.

An electrode voltage line HL, the first initialization voltage line VL1, a bottom scan line SL2a of the second scan line SL2, and a bottom scan line SL3a of the third scan line SL3 may extend in the x-direction and be apart from each other in the y-direction on the second gate insulating layer 113.

The electrode voltage line HL may cover at least a portion of the gate electrode G1 of the first thin film transistor T1 and serve as the second electrode CE2 of the first capacitor Cst. The electrode voltage line HL may include an opening. The first capacitor Cst includes the first electrode CE1 and the second electrode CE2 and may overlap the first thin film transistor T1. The gate electrode G1 of the first thin film transistor T1 may also serve as the first electrode CE1 of the first capacitor Cst. That is, the gate electrode G1 of the first thin film transistor T1 and the first electrode CE1 may be formed as one body.

The interlayer insulating layer 114 may be arranged on the second gate insulating layer 113. A second semiconductor layer may be arranged on the interlayer insulating layer 114, the second semiconductor layer including the semiconductor layer of each of the third thin film transistor T3 and the fourth thin film transistor T4. The second semiconductor layer may include zinc (Zn) oxide-based material and include zinc (Zn) oxide, indium (In)-zinc (Zn) oxide, and gallium (Ga)-indium (In)-zinc (Zn) oxide. According to some example embodiments, the second semiconductor layer may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The second semiconductor layer of the top pixel circuit PCa may be connected to the second semiconductor layer of the bottom pixel circuit PCb. The second semiconductor layer of the top pixel circuit PCa and the second semiconductor layer of the bottom pixel circuit PCb may be formed as one body.

Some regions of the second semiconductor layer may respectively constitute the semiconductor layers of the third thin film transistor T3 and the fourth thin film transistor T4. The semiconductor layers of the third thin film transistor T3 and the fourth thin film transistor T4 may each include a channel region, a source region, and a drain region, the source region and a drain region respectively being on two opposite sides of the channel region. The source regions S3 and S4 and the drain regions D3 and D4 of the third thin film transistor T3 and the fourth thin film transistor T4 may be formed by adjusting carrier concentration of an oxide semiconductor and making the source region and the drain region conductive. The source regions S3 and S4 and the drain regions D3 and D4 of the third thin film transistor T3 and the fourth thin film transistor T4 may be formed by increasing carrier concentration through plasma treatment that uses a hydrogen (H)-based gas, a fluorine (F)-based gas, or a combination thereof performed on the oxide semiconductor. FIG. 11 shows the channel region C4 of the fourth thin film transistor T4 as an example.

The second semiconductor layer may include the fourth electrode CE4 of the second capacitor Cbt. In a plan view, the fourth electrode CE4 of the second capacitor Cbt may be between the semiconductor layer of the third thin film transistor T3 and the semiconductor layer of the fourth thin film transistor T4. The fourth electrode CE4 may extend from the semiconductor layer of the third thin film transistor T3 or the semiconductor layer of the fourth thin film transistor T4. A portion of the first scan line SL1 overlapping the fourth electrode CE4 of the second capacitor Cbt may include the third electrode CE3 of the second capacitor Cbt.

The third gate insulating layer 115 may be arranged on the second semiconductor layer. The top scan line SL2b of the second scan line SL2 and a top scan line SL3b of the third scan line SL3 may extend in the x-direction on the third gate insulating layer 115. That is, the second scan line SL2 and the third scan line SL3 may include two conductive layers arranged on different layers.

The top scan line SL2b of the second scan line SL2 may overlap at least a portion of the bottom scan line SL2a. The top scan line SL3b of the third scan line SL3 may overlap at least a portion of a bottom scan line SL3a.

A portion of the bottom scan line SL2a of the second scan line SL2 overlapping the second semiconductor layer may include a bottom gate electrode G3a of the third thin film transistor T3, and a portion of the top scan line SL2b of the second scan line SL2 overlapping the second semiconductor layer may include a top gate electrode G3b of the third thin film transistor T3.

A portion of the bottom scan line SL3a of the third scan line SL3 overlapping the second semiconductor layer may include a bottom gate electrode G4a of the fourth thin film transistor T4, and a portion of the top scan line SL3b overlapping the second semiconductor layer may include a top gate electrode G4b of the fourth thin film transistor T4.

That is, the third thin film transistor T3 and the fourth thin film transistor T4 may each have a double-gate structure in which control electrodes are respectively provided on and under the semiconductor layer. The width of the bottom gate electrode G3a of the third thin film transistor T3 may be greater than the width of the top gate electrode G3b. The width of the bottom gate electrode G4a of the fourth thin film transistor T4 may be greater than the width of the top gate electrode G4b.

According to some example embodiments, the third gate insulating layer 115 may be patterned in a shape corresponding to the top scan line SL2b of the second scan line SL2 and the top scan line SL3b of the third scan line SL3.

A second interlayer insulating layer 116 may cover the third thin film transistor T3 and the fourth thin film transistor T4 on the third gate insulating layer 115. The driving voltage line PL, a node electrode 171, and connection electrodes 172, 173, 174, 175, and 176 may be arranged on the second interlayer insulating layer 116.

The driving voltage line PL, the node electrode 171, and the connection electrodes 172, 173, 174, 175, and 176 may include a material having high conductivity such as a conductive oxide. For example, the driving voltage line PL, the node electrode 171, and the connection electrodes 172, 173, 174, 175, and 176 may each include a single layer or a multi-layer including at least one of aluminum (Al), copper (Cu), or titanium (Ti). According to some example embodiments, the driving voltage line PL, the node electrode 171, and the connection electrodes 172, 173, 174, 175, and 176 may each include a triple layer of Ti/Al/Ti that are sequentially arranged.

The second interlayer insulating layer 116 may include an inorganic material including oxide or nitride. For example, the second interlayer insulating layer 116 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The third gate insulating layer 115 and the second interlayer insulating layer 116 may constitute the inorganic insulating layer IL shown in FIG. 6 in cooperation with the first gate insulating layer 112, the second gate insulating layer 113, and the interlayer insulating layer 114.

Branches protruding from the driving voltage line PL may be electrically and respectively connected to the source region S5 of the fifth thin film transistor T5 and the electrode voltage line HL through contact holes. Accordingly, wirings configured to apply the driving voltage ELVDD may have a mesh structure.

The node electrode 171 may contact and be electrically connected to the first gate electrode G1 of the first thin film transistor T1 and the second semiconductor layer through contact holes. One end of the node electrode 171 may be connected to the gate electrode G1 of the first thin film transistor T1 through an opening of the second electrode CE2 of the first capacitor Cst. The other end of the node electrode 171 may be connected to the fourth electrode CE4 of the second capacitor Cbt.

One end of the connection electrode 172 may be electrically connected to the drain region D1 of the first thin film transistor T1 and the source region S6 of the sixth thin film transistor T6 through contact holes. The other end of the connection electrode 172 may be electrically connected to the drain region D3 of the third thin film transistor T3 through a contact hole.

The connection electrode 173 may be electrically connected to the source region S2 of the second thin film transistor T2 through a contact hole.

The connection electrode 174 may be electrically connected to the drain region D6 of the sixth thin film transistor T6 through a contact hole.

One end of the connection electrode 175 may be electrically connected to the drain region D7 of the seventh thin film transistor T7 through a contact hole. The other end of the connection electrode 175 may be electrically connected to the second initialization voltage line VL2 through a contact hole.

The connection electrode 176 may be electrically connected to the source region S4 of the fourth thin film transistor T4 and the first initialization voltage line VL1 through contact holes.

The first planarization layer 117a and the second planarization layer 117b may be stacked on the second interlayer insulating layer 116. The data line DL and the connection metal CM may be between the first planarization layer 117a and the second planarization layer 117b.

The data line DL and the connection metal CM may include a conductive material including molybdenum (Mo), aluminum (Al), copper (Cu), and titanium (Ti) and include a single layer or a multi-layer. For example, the data line DL and the connection metal CM may include a multi-layered structure of Ti/Al/Ti.

The data line DL may be electrically connected to the source region S2 of the second thin film transistor T2 by being connected to the connection electrode 173 through a contact hole.

The connection metal CM is connected to the connection electrode 174 through a contact hole, and the pixel electrode 121 is connected to the connection metal CM through a via hole of the second planarization layer 117b. Therefore, the pixel electrode 121 may be electrically connected to the pixel circuit.

The pixel electrode 121 may be arranged on the second planarization layer 117b. The pixel-defining layer 119 may be arranged on the second planarization layer 117b and covering the edges of the pixel electrodes 121. FIG. 11 shows only the emission layer 122b. As described in FIG. 6, various functional layers may be further arranged on and/or under the emission layer 122b.

Figure 12:
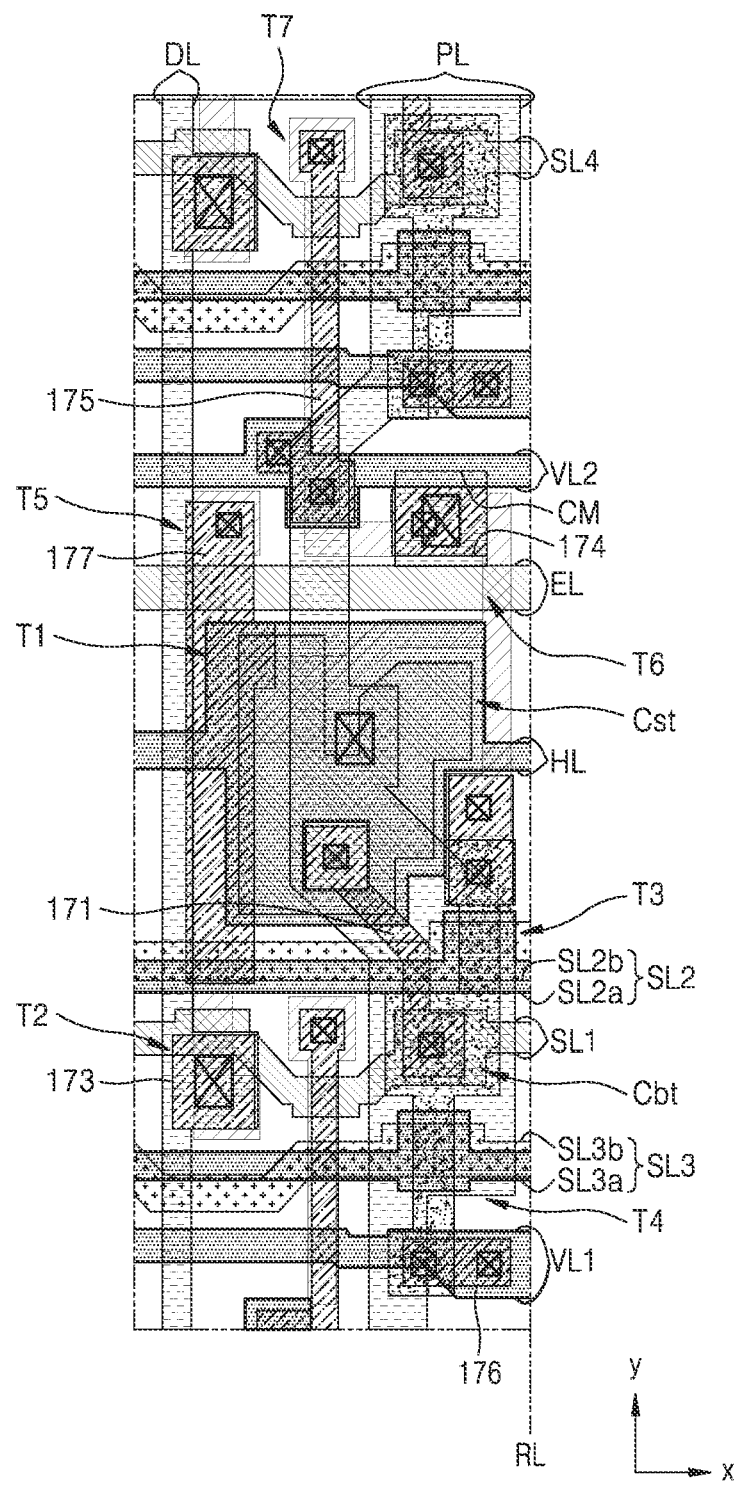
FIG. 12 is a plan view of a pixel circuit of a main sub-pixel according to some example embodiments.

FIG. 12 is a plan view of a pixel circuit PC of a main sub-pixel Pm according to some example embodiments. Hereinafter, elements different from those of FIG. 10 are mainly described. Some repetitive detailed descriptions of some the same elements as those of FIG. 10 may be omitted.

FIG. 12 is a plan view of a pixel circuit PC of a main sub-pixel Pm according to some example embodiments. FIG. 12 shows the pixel circuit PC in the main display area MDA shown in FIG. 8.

The pixel circuit PC may be connected to the first scan line SL1, the second scan line SL2, the third scan line SL3, the fourth scan line SL4, the emission control line EL, the first initialization voltage line VL1, and the second initialization voltage line VL2 each extending in the x-direction. In addition, the pixel circuit PC may be connected to the data line DL and the driving voltage line PL extending in the y-direction. The first initialization voltage line VL1 and the second initialization voltage line VL2 may be arranged on each row.

In the pixel circuit PC of the auxiliary sub-pixel Pa shown in FIG. 10, the driving voltage line PL is electrically connected to the source region S5 of the fifth thin film transistor T5 and the electrode voltage line HL. In contrast, in the pixel circuit of the main sub-pixel Pm shown in FIG. 12, the connection electrode 177 may be arranged on the second interlayer insulating layer 116, and the connection electrode 177 may be electrically connected to the source region S5 of the fifth thin film transistor T5 and the electrode voltage line HL through contact holes.

In the pixel circuit shown in FIG. 12, the driving voltage line PL may be arranged on the first planarization layer 117a, that is, on the same layer as the data line DL and may include the same material as the data line DL. The driving voltage line PL may be electrically connected to the electrode voltage line HL through a contact hole.

The semiconductor layer of the seventh thin film transistor T7 in the pixel circuit shown in FIG. 12 has a greater length in the y-direction than the semiconductor layer of the seventh thin film transistor T7 in the pixel circuit shown in FIG. 10.

The first scan line SL1 and the fourth scan line SL4 may be shared by two pixel circuits neighboring each other in the y-direction. That is, the fourth scan line SL4 may be electrically connected to the second thin film transistor of another pixel circuit adjacent above the pixel circuit shown in FIG. 12 in the (+) y-direction in the drawing. Therefore, a fourth scan signal SS4 applied to the fourth scan line SL4 may be transferred as a second scan signal to the second thin film transistor of the other pixel circuit. Likewise, the first scan line SL1 may be electrically connected to the seventh thin film transistor of another pixel circuit adjacent below the pixel circuit shown in FIG. 12 in the (−) y-direction in the drawing. Therefore, a first scan signal SS1 applied to the first scan line SL1 may be transferred as a fourth scan signal to the seventh thin film transistor of the other pixel circuit.

According to some example embodiments, the pixel circuit of the main sub-pixel Pm shown in FIG. 12 may be repeatedly arranged in the x-direction and the y-direction. According to some example embodiments, the pixel circuits of the main sub-pixel Pm may have a horizontally symmetric structure. That is, a pair of pixel circuits symmetric with respect to a dashed line RL of FIG. 12 may be repeatedly arranged in the main display area MDA in the x-direction and the y-direction.

Figure 13:
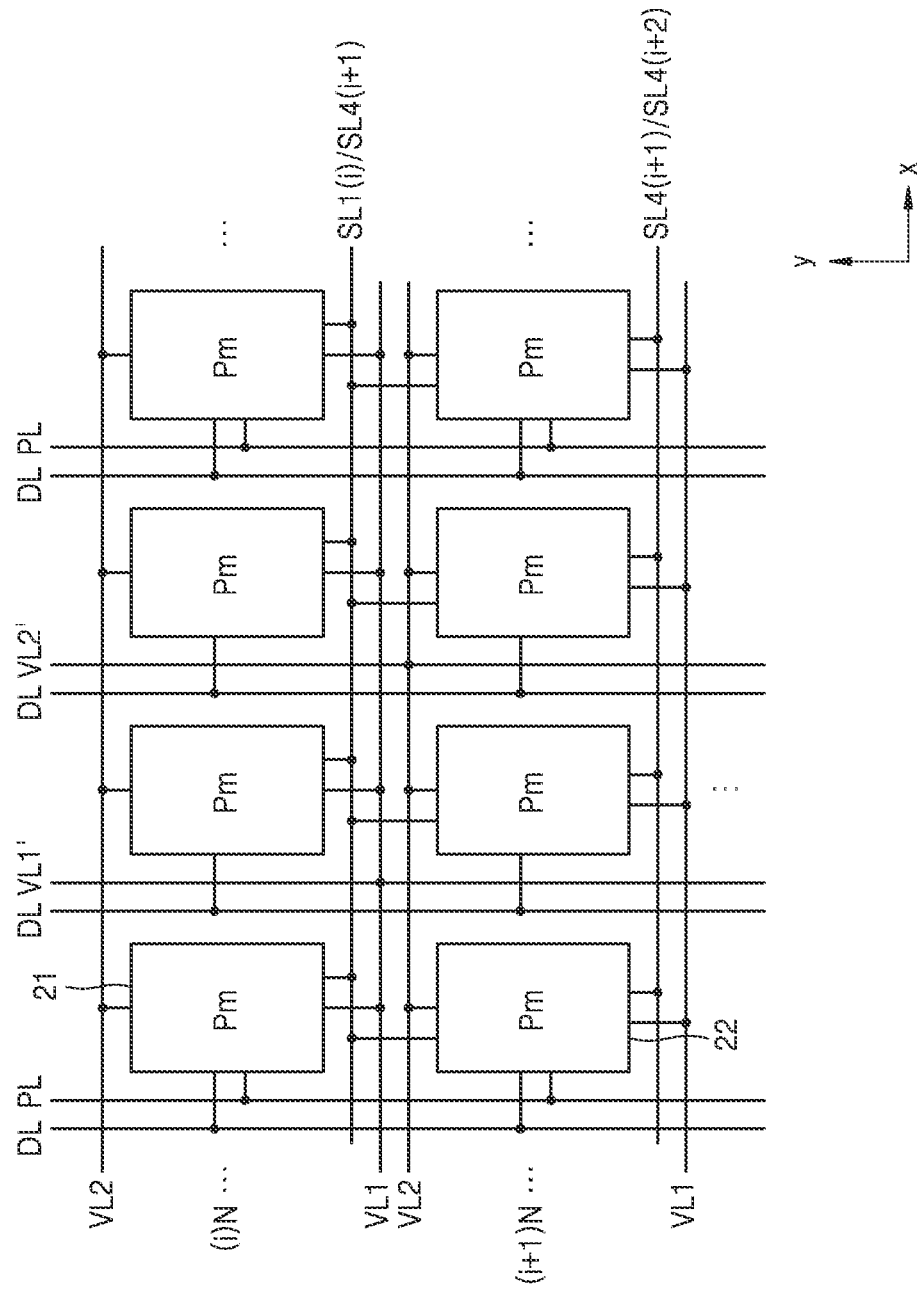
FIG. 13 is a view of the arrangement of wirings in the main display area according to some example embodiments.

FIG. 13 is a view of the arrangement of wirings in the main display area MDA according to some example embodiments. Hereinafter, configurations different from those of FIG. 8 are mainly described.

Referring to FIG. 13, a first vertical voltage line VL1' and a second vertical voltage line VL2' may be further arranged in the main display area MDA shown in FIG. 8. The first vertical voltage line VL1' and the second vertical voltage line VL2' may extend in the y-direction. The first vertical voltage line VL1' may be connected to the first initialization voltage line VL1 extending in the x-direction, and the second vertical voltage line VL2' may be connected to the second initialization voltage line VL2 extending in the x-direction. Accordingly, a wiring configured to supply the first initialization voltage Vint1 and a wiring configured to supply the second initialization voltage Vint2 may have a mesh structure.

The first vertical voltage line VL1' may be arranged on a layer different from the first initialization voltage line VL1 and electrically connected to the first initialization voltage line VL1 by contacting the first initialization voltage line VL1 through a contact hole. The second vertical voltage line VL2' may be arranged on a layer different from the second initialization voltage line VL2 and electrically connected to the second initialization voltage line VL2 by contacting the second initialization voltage line VL2 through a contact hole.

The first vertical voltage line VL1' and the second vertical voltage line VL2' may be arranged on the same layer. The first vertical voltage line VL1' and the second vertical voltage line VL2' may be arranged on the same layer as the data line DL or the driving voltage line PL. The first vertical voltage line VL1' and the second vertical voltage line VL2' may include the same material as the data line DL or the driving voltage line PL.

In the main display area MDA, the driving voltage line PL, the first vertical voltage line VL1', and the second vertical voltage line VL2' may be alternately arranged with a constant interval (e.g. with a column interval) in the x-direction. That is, in the main display area MDA, one of the driving voltage line PL, the first vertical voltage line VL1', and the second vertical voltage line VL2' may extend in the y-direction.

Figure 14:
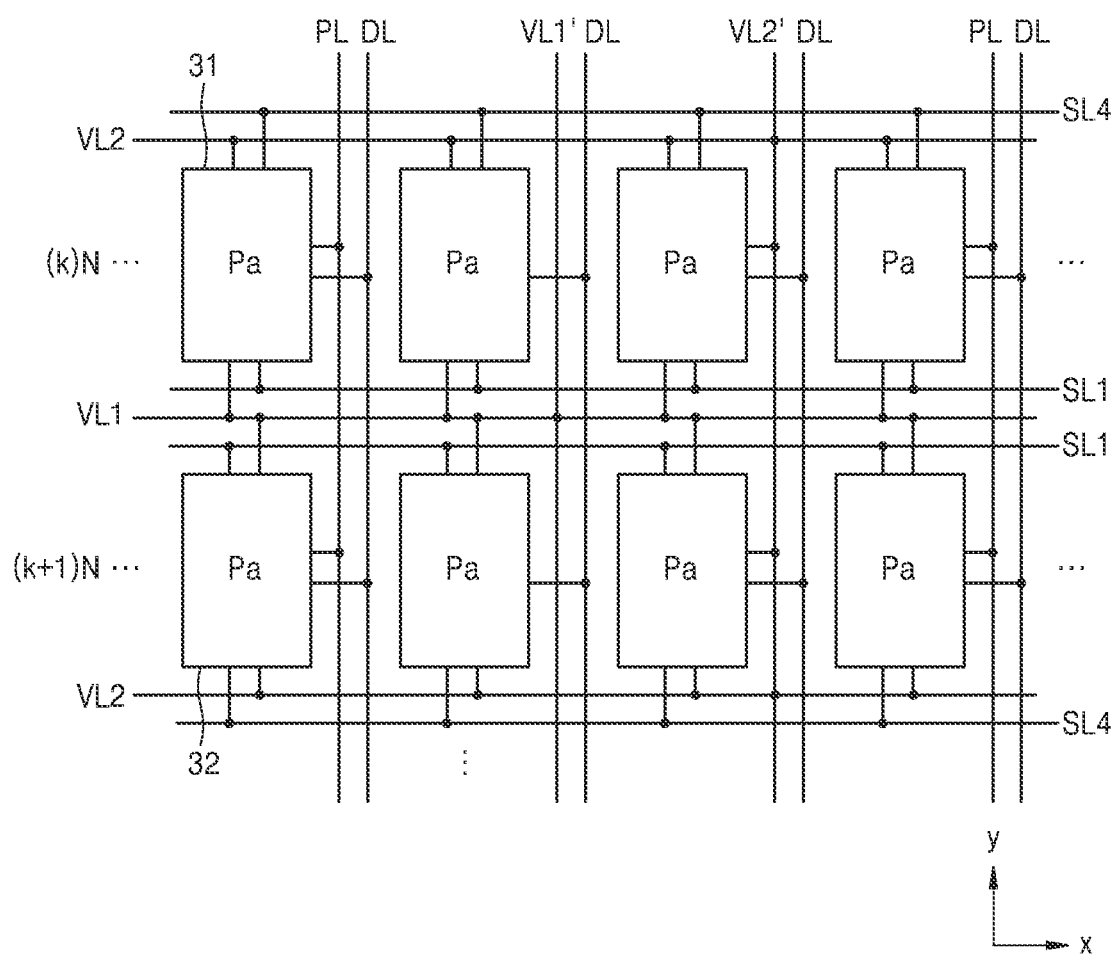
FIG. 14 is a view of the arrangement of wirings in the component area according to some example embodiments.

FIG. 14 is a view of the arrangement of wirings in the component area CA according to some example embodiments. Hereinafter, configurations different from those of FIG. 9 are mainly described.

Referring to FIG. 14, the first vertical voltage line VL1' and the second vertical voltage line VL2' extending in the y-direction may be further arranged in the component area CA shown in FIG. 9. The first vertical voltage line VL1' and the second vertical voltage line VL2' may extend in the y-direction. The first vertical voltage line VL1' may be connected to the first initialization voltage line VL1 extending in the x-direction, and the second vertical voltage line VL2' may be connected to the second initialization voltage line VL2 extending in the x-direction. Accordingly, a wiring configured to supply the first initialization voltage Vint1 and a wiring configured to supply the second initialization voltage Vint2 may have a mesh structure.

The first initialization voltage line VL1 may be between pixel circuits of two auxiliary sub-pixels Pa on the same column and neighboring rows and be connected to the two auxiliary sub-pixels Pa. The pixel circuits of the two auxiliary sub-pixels Pa may be symmetric with respect to the first initialization voltage line VL1. For example, the pixel circuit connected to the auxiliary sub-pixel 31 and the pixel circuit connected to the auxiliary sub-pixel 33 may be symmetric with respect to the first initialization voltage line VL1.

The first vertical voltage line VL1' may be arranged on a layer different from the first initialization voltage line VL1 and be electrically connected to the first initialization voltage line VL1 by contacting the first initialization voltage line VL1 through a contact hole. The second vertical voltage line VL2' may be arranged on a layer different from the second initialization voltage line VL2 and be electrically connected to the second initialization voltage line VL2 by contacting the second initialization voltage line VL2 through a contact hole.

The first vertical voltage line VL1' and the second vertical voltage line VL2' may be arranged on the same layer. The first vertical voltage line VL1' and the second vertical voltage line VL2' may be arranged on the same layer as the data line DL or the driving voltage line PL. The first vertical voltage line VL1' and the second vertical voltage line VL2' may include the same material as the data line DL or the driving voltage line PL.

In the component area CA, the driving voltage line PL, the first vertical voltage line VL1', and the second vertical voltage line VL2' may be alternately arranged with a constant interval (e.g. with a column interval) in the x-direction. That is, in the component area CA, one of the driving voltage line PL, the first vertical voltage line VL1', and the second vertical voltage line VL2' may extend in the y-direction on each column.

In the embodiments of FIGS. 13 and 14, the driving voltage line PL may not be arranged on a column on which the first vertical voltage line VL1' and the second vertical voltage line VL2' are arranged. In this case, since the driving voltage lines PL on neighboring columns are connected to the electrode voltage line HL, the driving voltage ELVDD may be supplied to auxiliary sub-pixels Pa of a column on which the first vertical voltage line VL1' and the second vertical voltage line VL2' are arranged.

Figure 15:
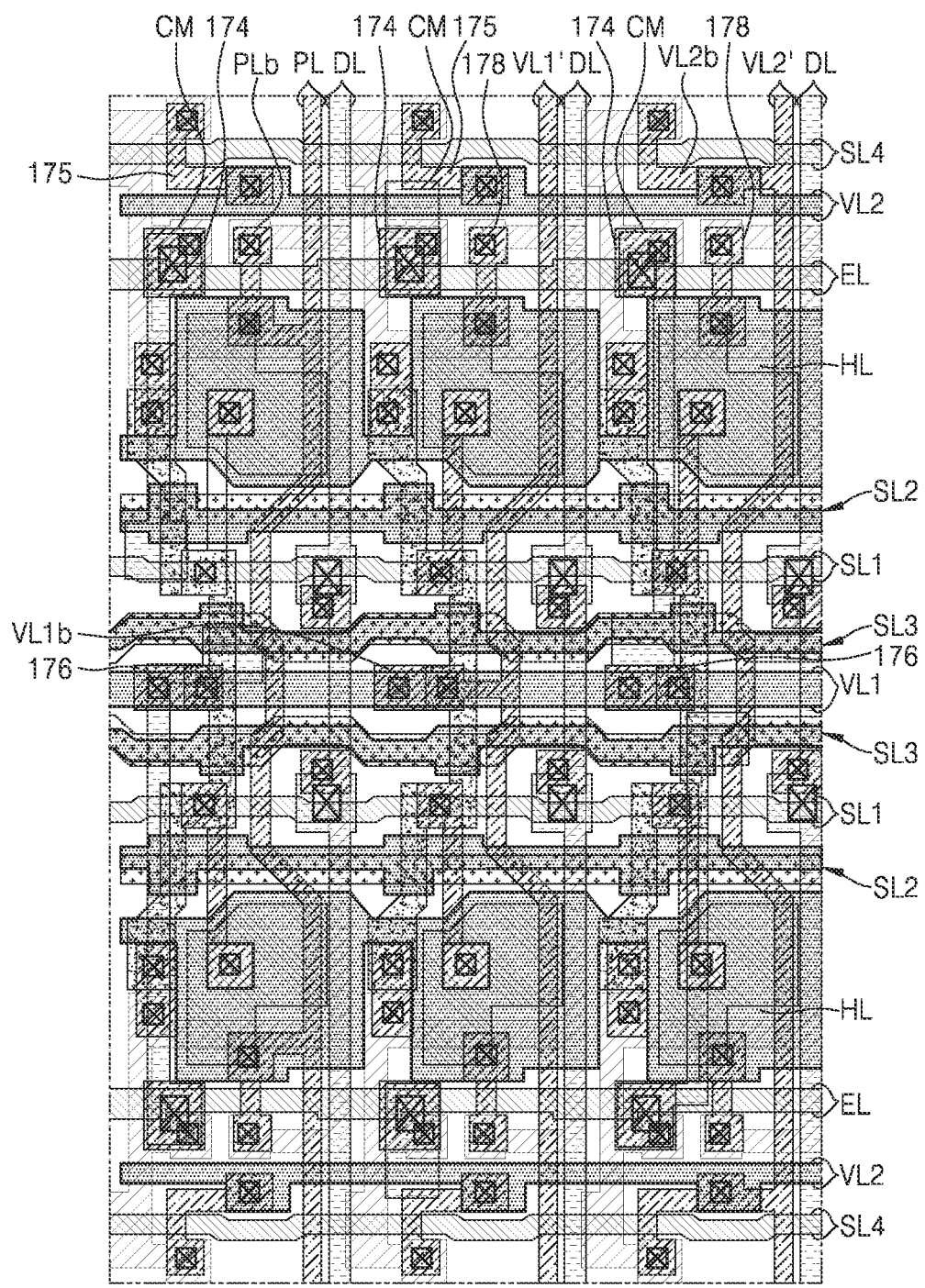
FIG. 15 is a plan view of the arrangement of pixel circuits of auxiliary sub-pixels according to some example embodiments.

FIG. 15 is a plan view of the arrangement of pixel circuits PC of auxiliary sub-pixels Pa according to some example embodiments. FIG. 15 shows pixel circuits PC arranged in a portion of the component area CA shown in FIG. 14.

In the component area CA, the driving voltage line PL, the first vertical voltage line VL1', and the second vertical voltage line VL2' may be alternately arranged with a column interval in the x-direction and accordingly one of the driving voltage line PL, the first vertical voltage line VL1', and the second vertical voltage line VL2' may extend in the y-direction on each column.

In the pixel circuits of a column on which the driving voltage line PL is arranged, branches PLb protruding from the driving voltage line PL may be electrically connected to the source region S5 of the fifth thin film transistor T5 and the electrode voltage line HL through contact holes. The pixel circuits of a column on which the first vertical voltage line VL1' and the second vertical voltage line VL2' are arranged may be electrically connected to each of the source region S5 of the fifth thin film transistor T5 and the electrode voltage line HL through contact holes by a connection electrode 178

In the pixel circuits of a column on which the driving voltage line PL is arranged and the pixel circuits of a column on which the second vertical voltage line VL2' is arranged, the source region D4 of the fourth thin film transistor T4 may be electrically connect to the first initialization voltage line VL1 by the connection electrode 176. In the pixel circuits of a column on which the first vertical voltage line VL1' is arranged, a branch VL1b protruding from the first vertical voltage line VL1' may be electrically connected to each of the source region D4 of the fourth thin film transistor T4 and the first initialization voltage line VL1.

In the pixel circuits of a column on which the driving voltage line PL is arranged and the pixel circuit of a column on which the first vertical voltage line VL1' is arranged, the drain electrode D7 of the seventh thin film transistor T7 may be electrically connected to the second initialization voltage line VL2 by the connection electrode 175. In the pixel circuits of a column on which the second vertical voltage line VL2' is arranged, a branch VL2b protruding from the second vertical voltage line VL2' may be electrically connected to each of the source region S7 of the seventh thin film transistor T7 and the second initialization voltage line VL2.

Figure 16:
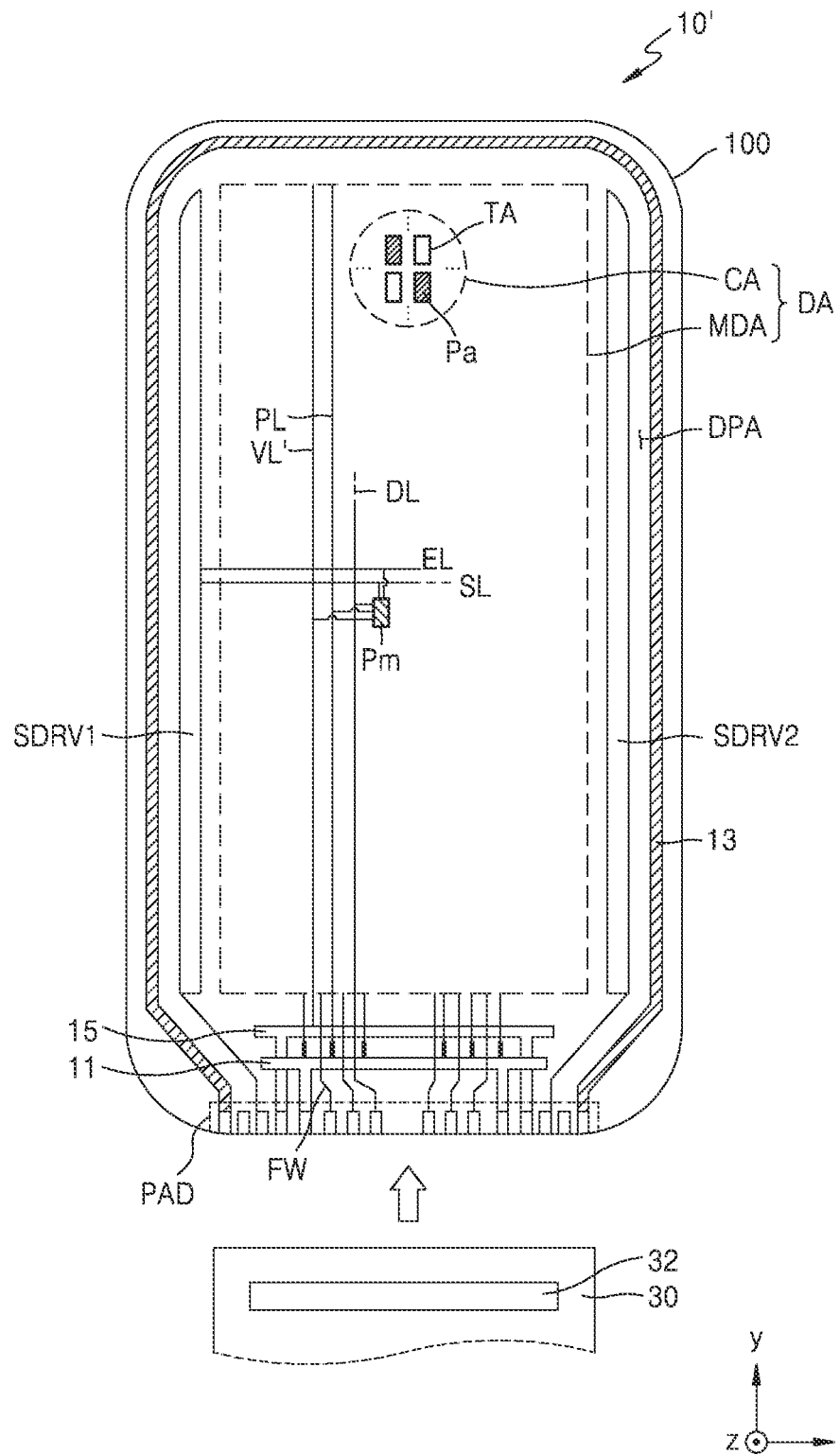
FIG. 16 is a plan view of a display panel according to some example embodiments.

FIG. 16 is a plan view of a display panel 10' according to some example embodiments.

The display panel 10' shown in FIG. 16 is different from the embodiment of FIG. 3 in that the initialization voltage supply line 15 is arranged below the main display area MDA. According to some example embodiments, the initialization voltage supply line 15 may be arranged over the main display area MDA or arranged both above and below the main display area MDA. According to some example embodiments, the initialization voltage supply line 15 may be arranged on the left and right of the main display area MDA as shown in FIG. 3 and arranged above and/or below the main display area MDA as shown in FIG. 16.

The initialization voltage supply line 15 may be configured to apply an initialization voltage to the pixel circuits of sub-pixels, that is, the main and auxiliary sub-pixels Pm and Pa through the vertical voltage line VL' extending in the y-direction. The vertical voltage VL' may include the first vertical voltage line VL1' and the second vertical voltage line VL2' shown in FIGS. 13 to 15. Though FIG. 16 shows one initialization voltage supply line 15, an initialization voltage supply line connected to the first vertical voltage line VL1' and an initialization voltage supply line connected to the second vertical voltage line VL2' may be provided in the peripheral area DPA.

As shown in FIGS. 13 to 15, the first vertical voltage line VL1' may be electrically connected to the first initialization voltage line VL1, and the second vertical voltage line VL2' may be electrically connected to the second initialization voltage line VL2. In this case, the first initialization voltage line VL1 and the second initialization voltage line VL2 may receive an initialization voltage through the first vertical voltage line VL1' and the second vertical voltage line VL2'.

Though the above embodiments describe the pixel circuit including the first thin film transistor that includes a silicon semiconductor and the second thin film transistor that includes an oxide semiconductor, the embodiments according to the present disclosure are not limited thereto. For example, the embodiment is applicable to a pixel circuit connected to the first initialization voltage line and the second initialization voltage line, the pixel circuit including only thin film transistors that include a silicon semiconductor and only thin film transistors that include an oxide semiconductor.

As described above, in the display panel and the display apparatus according to the present embodiments, because the pixel circuits that are vertically arranged share the initialization voltage line, a transmittance of the component area may be secured. However, the scope of embodiments according to the present disclosure are not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
    a substrate including a first display area having a first resolution and a second display area having a second resolution lower than the first resolution;
    a first pixel circuit in the second display area;
    a second pixel circuit neighboring the first pixel circuit in a first direction in the second display area;
    a third pixel circuit neighboring the second pixel circuit in a second direction in the second display area, the second direction being perpendicular to the first direction;
    a fourth pixel circuit neighboring the first pixel circuit in the second direction and neighboring the third pixel circuit in the first direction in the second display area; and
    a first voltage line in the second display area, extending in the first direction, arranged between the first pixel circuit and the fourth pixel circuit and arranged between the second pixel circuit and the third pixel circuit,
    wherein the first pixel circuit and the fourth pixel circuit are symmetric with respect to the first voltage line, and the second pixel circuit and the third pixel circuit are symmetric with respect to the first voltage line.

2. The display device of claim 1, wherein an arrangement of components of the first pixel circuit and an arrangement of components of the second pixel circuit are the same with respect to a boundary between the first pixel circuit and the second pixel circuit, and wherein an arrangement of components of the third pixel circuit and an arrangement of components of the fourth pixel circuit are the same with respect to a boundary between the third pixel circuit and the fourth pixel circuit.

3. The display device of claim 1, wherein each of the first pixel circuit, the second pixel circuit, the third pixel circuit and the fourth pixel circuit comprises:
a driving transistor; and
a first transistor connected to a gate of the driving transistor and the first voltage line.

4. The display device of claim 1, further comprising:
a first vertical voltage line extending in the second direction, arranged between the first pixel circuit and the second pixel circuit and arranged between the third pixel circuit and the fourth pixel circuit.

5. The display device of claim 4, further comprising:
a first voltage supply line in a peripheral area being outside the first display area and connected to the first voltage line.

6. The display device of claim 4, wherein the first voltage line and the first vertical voltage line are configured to receive a same voltage.

7. The display device of claim 4, wherein the first vertical voltage line and the first voltage line are connected each other.

8. The display device of claim 4, wherein the first vertical voltage line and the first voltage line are disposed in different layers each other.

9. The display device of claim 4, further comprising:
a first voltage supply line in a peripheral area being outside the first display area and connected to the first vertical voltage line.

10. The display device of claim 1, wherein each of the first pixel circuit, the second pixel circuit, the third pixel circuit and the fourth pixel circuit is connected to a display element in the second display area, and
wherein each of the first pixel circuit, the second pixel circuit, the third pixel circuit and the fourth pixel circuit further comprises:
a second transistor connected to the display element and a second voltage line.

11. The display device of claim 10, wherein a first initialization voltage applied to the first voltage line is different from a second initialization voltage applied to the second voltage line.

12. The display device of claim 10, further comprising:
a second voltage supply line in a peripheral area being outside the first display area and connected to the second voltage line.

13. A display device comprising:
a substrate including a first display area having a first resolution and a second display area having a second resolution lower than the first resolution;
a first pixel circuit in the first display area;
a second pixel circuit neighboring the first pixel circuit in a first direction in the first display area;
a third pixel circuit in the second display area;
a fourth pixel circuit neighboring the third pixel circuit in the first direction in the second display area;
a first voltage line in the first display area, extending in a second direction perpendicular to the first direction and connected to the first pixel circuit;
a second voltage line in the first display area, extending in the second direction and connected to the second pixel circuit; and
a third voltage line in the second display area, extending in the second direction, arranged between the third pixel circuit and the fourth pixel circuit and connected to the third pixel circuit and the fourth pixel circuit,
wherein the first voltage line, the second voltage line and the third voltage line are configured to receive a same voltage.

14. The display device of claim 13, wherein the third pixel circuit and the fourth pixel circuit are symmetric with respect to the third voltage line.

15. The display device of claim 13, further comprising:
a bottom layer in the second display area,
wherein the bottom layer is between the substrate and the third pixel circuit.

16. The display device of claim 15, wherein the bottom layer is not disposed in a transmission area around the third pixel circuit and the fourth pixel circuit in the second display area.

17. The display device of claim 15, further comprising an electronic element arranged below the substrate to correspond to the second display area.

18. The display device of claim 13, wherein each of the third pixel circuit and the fourth pixel circuit comprises:
a first driving transistor; and
a first transistor connected to a gate of the first driving transistor and the third voltage line.

19. The display device of claim 18, wherein each of the first pixel circuit and the second pixel circuit comprises:
a second driving transistor; and
a second transistor connected to a gate of the second driving transistor,
wherein the second transistor of the first pixel circuit is connected to the first voltage line, and the second transistor of the second pixel circuit is connected to the second voltage line.

20. The display device of claim 13, further comprising:
a first vertical voltage line in the first display area, extending in the first direction and connected to the first voltage line and the second voltage line; and
a second vertical voltage line in the second display area, extending in the first direction and connected to the third voltage line.

* * * * *